(12) United States Patent
Siprak et al.

(10) Patent No.: US 11,380,755 B2
(45) Date of Patent: Jul. 5, 2022

(54) COMPOUND CAPACITOR STRUCTURES

(71) Applicant: Intel Corporation, Santa Clara, CA (US)

(72) Inventors: Domagoj Siprak, Munich (DE); Jonas Fritzin, Munich (DE); Sundaravadanan Anantha Krishnan, Munich (DE)

(73) Assignee: Intel Corporation, Santa Clara, CA (US)

( * ) Notice: Subject to any disclaimer, the term of this patent is extended or adjusted under 35 U.S.C. 154(b) by 111 days.

(21) Appl. No.: 16/650,826

(22) PCT Filed: Dec. 18, 2017

(86) PCT No.: PCT/US2017/067094
§ 371 (c)(1),
(2) Date: Mar. 25, 2020

(87) PCT Pub. No.: WO2019/125385
PCT Pub. Date: Jun. 27, 2019

(65) Prior Publication Data
US 2020/0279908 A1 Sep. 3, 2020

(51) Int. Cl.
*H01L 49/02* (2006.01)
*H01L 23/66* (2006.01)
(Continued)

(52) U.S. Cl.
CPC .......... *H01L 28/86* (2013.01); *H01L 23/5223* (2013.01); *H01L 23/5227* (2013.01);
(Continued)

(58) Field of Classification Search
CPC . H01L 28/86; H01L 23/66; H01L 2223/6627; H01L 23/5223; H01L 23/5227; H01P 3/026
See application file for complete search history.

(56) References Cited

U.S. PATENT DOCUMENTS

| | | | |
|---|---|---|---|
| 7,230,434 B1 * | 6/2007 | Sasaki | H01L 23/5223 257/532 |
| 7,446,995 B2 * | 11/2008 | Jow | H01G 4/005 361/303 |

(Continued)

FOREIGN PATENT DOCUMENTS

| | | |
|---|---|---|
| EP | 2337071 | 6/2011 |
| WO | WO-2014-204792 | 12/2014 |

OTHER PUBLICATIONS

International Search Report and Written Opinion for International Patent Application No. PCT/US2017/067094 dated Sep. 11, 2018, 17 pgs.

(Continued)

*Primary Examiner* — Ahmed N Sefer
(74) *Attorney, Agent, or Firm* — Schwabe, Williamson & Wyatt P.C.

(57) ABSTRACT

Capacitors are disclosed. A capacitor includes a plate-to-plate capacitor and a finger-to-finger capacitor. The plate-to-plate capacitor includes at least a first plate and a second plate. The second plate is in proximity to the first plate. The finger to finger capacitor is in proximity to the first plate. The finger to finger capacitor includes a first plurality of finger elements and a second plurality of finger elements. The second plurality of finger elements is interleaved with the first plurality of finger elements. The first plurality of finger elements is electrically connected to the first plate and the second plurality of finger elements is electrically connected to the second plate. The second plurality of finger elements and the first plate form additional plate-to-plate capacitors.

20 Claims, 17 Drawing Sheets

(51) Int. Cl.
*H01P 3/02* (2006.01)
*H01L 23/522* (2006.01)
(52) U.S. Cl.
CPC .............. *H01L 23/66* (2013.01); *H01P 3/026* (2013.01); *H01L 2223/6627* (2013.01)

(56) References Cited

U.S. PATENT DOCUMENTS

| | | | |
|---|---|---|---|
| 7,838,384 B2* | 11/2010 | Cho | H01L 27/0805 |
| | | | 438/396 |
| 9,224,685 B1* | 12/2015 | Ding | H01L 28/86 |
| 2007/0075341 A1* | 4/2007 | Pan | H01L 27/0811 |
| | | | 257/287 |
| 2007/0267733 A1 | 11/2007 | Cho et al. | |
| 2010/0295156 A1 | 11/2010 | Cho et al. | |
| 2011/0151803 A1* | 6/2011 | van der Heijden | |
| | | | H01L 23/5223 |
| | | | 455/73 |
| 2012/0007215 A1 | 1/2012 | Darabi et al. | |
| 2012/0094463 A1 | 4/2012 | Mcleod | |
| 2014/0103490 A1 | 4/2014 | Kumar et al. | |
| 2014/0231957 A1 | 8/2014 | Zhu et al. | |
| 2015/0028407 A1 | 1/2015 | Luo et al. | |
| 2016/0381797 A1* | 12/2016 | Zhou | H01L 28/60 |
| | | | 174/251 |
| 2017/0301675 A1* | 10/2017 | Harjani | H01L 27/0805 |

OTHER PUBLICATIONS

Extended European Search Report for European Patent Application No. 17935502.9 dated Jun. 30, 2021, 7 pgs.

\* cited by examiner

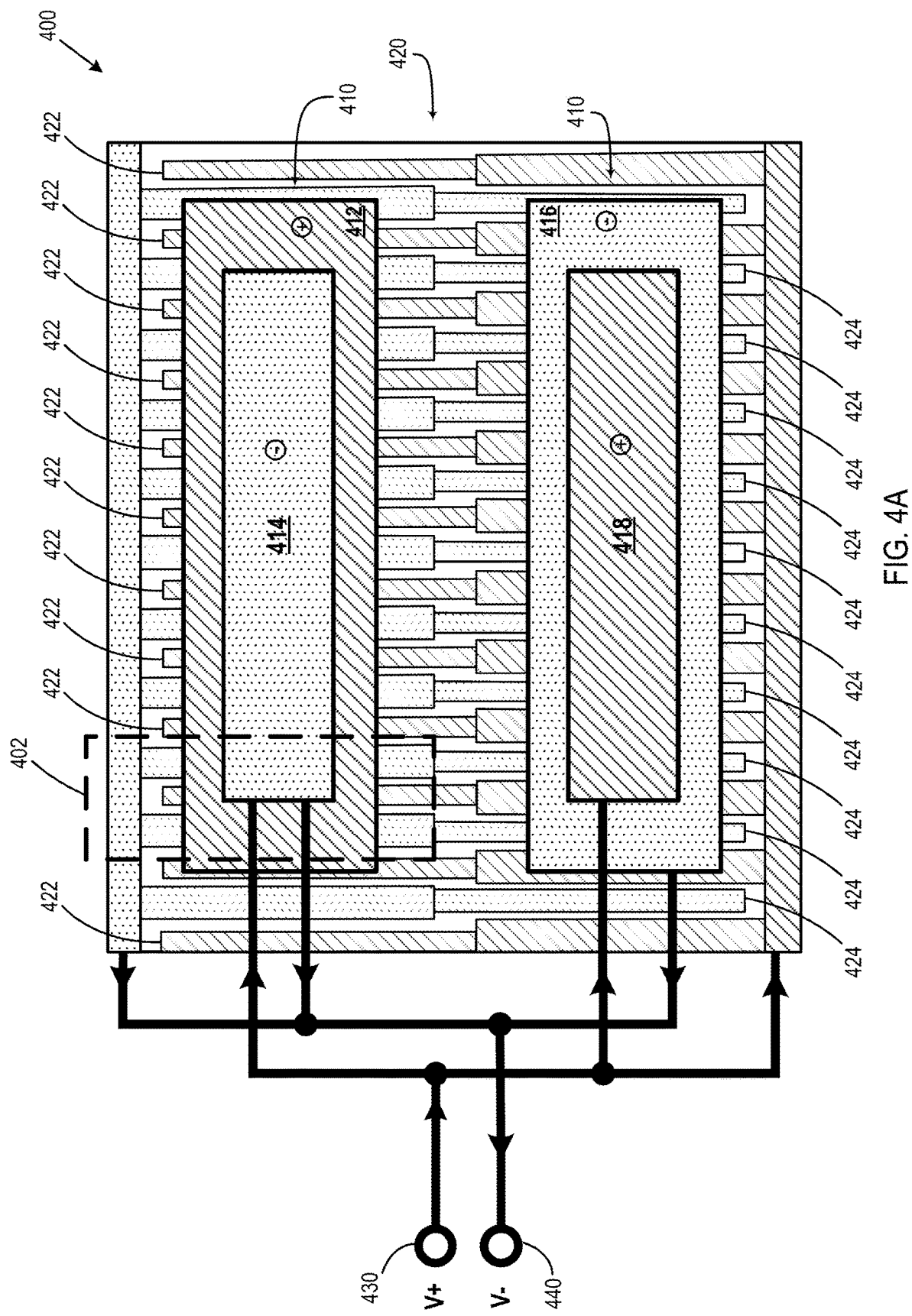

COMPOUND CAPACITOR STRUCTURES

CROSS-REFERENCE TO RELATED APPLICATION

This patent application is a U.S. National Phase Application under 35 U.S.C. § 371 of International Application No. PCT/US2017/067094, filed Dec. 18, 2017, entitled "COMPOUND CAPACITOR STRUCTURES," which designates the United States of America, the entire disclosure of which is hereby incorporated by reference in its entirety and for all purposes.

BACKGROUND

The capacitor quality factor, also known as Q factor, of a capacitor is a ratio between a reactance and a resistance of a capacitor. Relatively higher Q factors are usually associated with higher quality capacitors. Other metrics relevant to determining the quality of a capacitor include the resonance frequency of the capacitor, and the parasitic inductance of the capacitor.

BRIEF DESCRIPTION OF THE DRAWINGS

FIGS. 4A-4C are simplified views of a capacitor, according to some embodiments.

DETAILED DESCRIPTION

Figure 1:
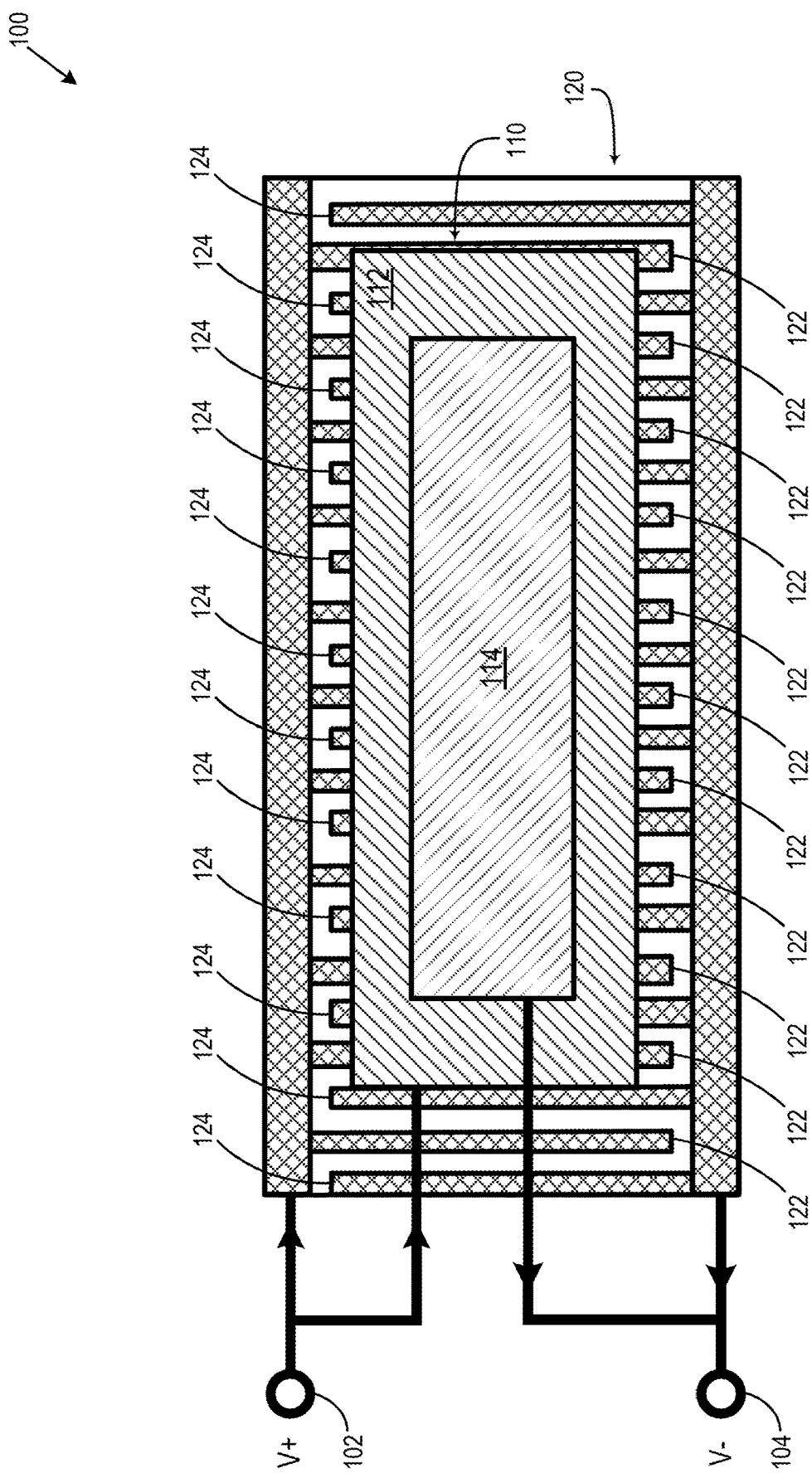
FIG. 1 is a simplified layout view of a capacitor according to some embodiments.

Described herein are compound capacitor structures, and related devices. In the following description, various aspects of the illustrative implementations will be described using terms commonly employed by those skilled in the art to convey the substance of their work to others skilled in the art. However, it will be apparent to those skilled in the art that the disclosure may be practiced with only some of the described aspects. For purposes of explanation, specific numbers, materials and configurations are set forth in order to provide a thorough understanding of the illustrative implementations. However, it will be apparent to one skilled in the art that the disclosure may be practiced without the specific details. In other instances, well-known features are omitted or simplified in order not to obscure the illustrative implementations.

Various operations will be described as multiple discrete operations, in turn, in a manner that is most helpful in understanding the disclosure. The order of the description, however, should not be construed to imply that these operations are necessarily order dependent. In particular, these operations need not be performed in the order of presentation.

The terms "over," "under," "between," and "on," as used herein, refer to a relative position of one material (e.g., region, structure, layer, etc.) or component with respect to other materials (e.g., regions, structures, layers, etc.) or components. For example, one material disposed over, on, or under another material may be directly in contact with the other material or may have one or more intervening materials. Moreover, one material disposed between two materials may be directly in contact with the two materials or may have one or more intervening materials. Also, to the extent that the terms "over," "under," and "on" imply a vertical orientation, this orientation is not intended to be limiting. Rather, it is noted that any materials or components that are discussed herein as being "over," "under," or "on" any other materials or components are contemplated as capable of being equivalently oriented horizontally, at some non-vertical and non-horizontal orientation or in some non-linear or angular orientation, without departing from the scope of the disclosure.

Implementations of the disclosure may be formed or carried out on a substrate, such as a semiconductor substrate. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, indium antimonide, lead telluride, indium arsenide, indium phosphide, gallium arsenide, indium gallium arsenide, gallium antimonide, gallium nitride, or other combinations of group III-V or group IV materials. Although a few examples of materials from which the substrate may be formed are described here, any material that may serve as a foundation upon which a semiconductor device may be built falls within the spirit and scope of the disclosure.

The Third Generation Partner Project (3GPP) is preparing to launch fifth generation (5G) wireless systems. In 5G the operating frequency will range from about twenty-four gigahertz (24 GHz) to about one hundred gigahertz (100 GHz). At these frequencies, each micrometer (μm) of a device (e.g., a semiconductor device, a chip, a baseband processor, a communications processor, other processors, millimeter wave transceivers, antennas, power amplifiers, etc.) may influence performance of a device because even very small features of a device may introduce inductive, resistive, and/or capacitive parasitic elements. As a result, in designing such a device, a high degree of resolution may be employed when modeling the device and its performance.

In circuits where large capacitors (e.g., stabilization capacitors) are used, such as power amplifiers, a relatively large physical area of these capacitors may introduce relatively large parasitic inductance, which may cause unwanted behavior and instability. Thus, design of these relatively large capacitors should aim to reduce the parasitic inductance where possible.

Proposed herein are compound capacitor structures that are designed to improve quality of the capacitors (e.g., improve the Q factor, the resonant frequency, parasitic inductance, etc.). The proposed structure achieves a relatively large capacitor with a relatively high Q factor. Such structures are suitable for mm-Wave frequencies. In some embodiments, a capacitor structure includes a first plate-toplate capacitor and a second plate-to-plate capacitor oriented with respect to each other to reduce parasitic inductance.

In some embodiments, a capacitor structure includes one or more plate-to-plate inter-metal capacitors in proximity to (e.g., over or under) a finger-to-finger intra-metal capacitor given a specific orientation to improve the resonance frequency by canceling the wiring inductance. In some embodiments, the plate-to-plate capacitors and the finger-to-finger capacitors are oriented in a ninety degree (90°) phase shift. Also, in some embodiments, the plate-to-plate capacitors, the finger-to-finger capacitors, or both the plate-to-plate capacitors and the finger-to-finger capacitors are oriented to create anti-parallel currents to cancel inductance in the interconnects. The orientation and polarity of the plates in the plate-to-plate capacitors further improve the inductance cancellation. Also, due to the orientation of the finger-to-finger capacitors the inductance cancellation in the plate-to-plate capacitors is not reduced. Furthermore, in addition to the inductance cancellation, the orientation of the plate-to-plate capacitors in relation to the finger-to-finger capacitor creates additional capacitance between the two capacitors. Means to increase (e.g., optimize) the capacitance and Q factor are provided, as well as various proposed capacitor layouts.

Capacitor layouts are proposed to provide inductance cancellation in a plate-to-plate capacitor simultaneously with inductance cancellation in a finger-to-finger capacitor in proximity therewith. These capacitor layouts are configured to improve (optimize) this simultaneous inductance cancellation. As a result, lower loss occurs in operation of capacitors designed according to these proposed capacitor layouts.

Using concepts disclosed herein, a large resonance frequency may be achieved as well as a relatively high capacitance and Q factor. Capacitors designed as disclosed herein may have sufficient quality for use in high-frequency (e.g., millimeter wave) applications such as 5G devices.

Embodiments disclosed herein may be carried out on or in a semiconductor substrate. Structures of capacitors are discussed herein. These capacitors include electrically conductive structures (e.g., plates, finger elements, transmission lines, traces, etc.). These electrically conductive structures may include metals (e.g., aluminum, copper, tungsten, etc.), metal alloys, metal compounds, polysilicon, highly doped semiconductor material, other conductive materials, or combinations thereof. These electrically conductive structures may be carried by electrically insulating materials (e.g., oxides, nitrides, non-doped or slightly doped semiconductor materials, other electrically insulating materials, or combinations thereof).

FIG. 1 is a simplified layout view of a capacitor 100 according to some embodiments. The capacitor 100 includes a plate-to-plate capacitor 110 in proximity to (e.g., over or under) a finger-to-finger intra-metal capacitor 120 (sometimes referred to simply as "finger-to-finger capacitor" 120). The plate-to-plate capacitor 110 and the finger-to-finger capacitor 120 are electrically connected to each other in parallel. As a result, the plate-to-plate capacitor 110 and the finger-to-finger capacitor 120 share capacitor terminals 102, 104. The capacitor terminals include a first terminal 102 (e.g., a positive terminal) and a second terminal 104 (e.g., a negative terminal).

The plate-to-plate capacitor 110 includes a first plate 112 electrically connected to the first capacitor terminal 102. The first plate 112 includes an electrically conductive material. The plate-to-plate capacitor 110 also includes a second plate 114 electrically connected to the second capacitor terminal 104. The second plate 114 includes an electrically conductive material. The second plate 114 is at least substantially parallel to the first plate 112 and is offset from the first plate 112 in a substantially normal direction from the first plate 112. In FIG. 1 the second plate 114 is illustrated as having a smaller area from the layout perspective than the first plate 112 in order to show both the first plate 112 and the second plate 114. In practice, however, the first plate 112 and the second plate 114 may be the same size, different sizes (either the first plate 112 or the second plate 114 may be larger than the other of the first plate 112 and the second plate 114), or shapes other than rectangular (e.g., the same or different shapes).

The finger-to-finger capacitor 120 includes a first plurality of finger elements 122 electrically connected to the first capacitor terminal 102. The first plurality of finger elements 122 includes electrically conductive material. The finger-to-finger capacitor 120 also includes a second plurality of finger elements 124 interleaved with the first plurality of finger elements 122. The second plurality of finger elements 124 is electrically connected to the second capacitor terminal 104. The second plurality of finger elements 124 includes electrically conductive material.

At least a portion of the second plurality of finger elements 124 is located in proximity to the first plate 112 to induce capacitive coupling between the first plate 112 and the at least the portion of the second plurality of finger elements 124 responsive to a voltage potential difference v+, v− applied across the first capacitor terminal 102 and the second capacitor terminal 104.

Figure 2:
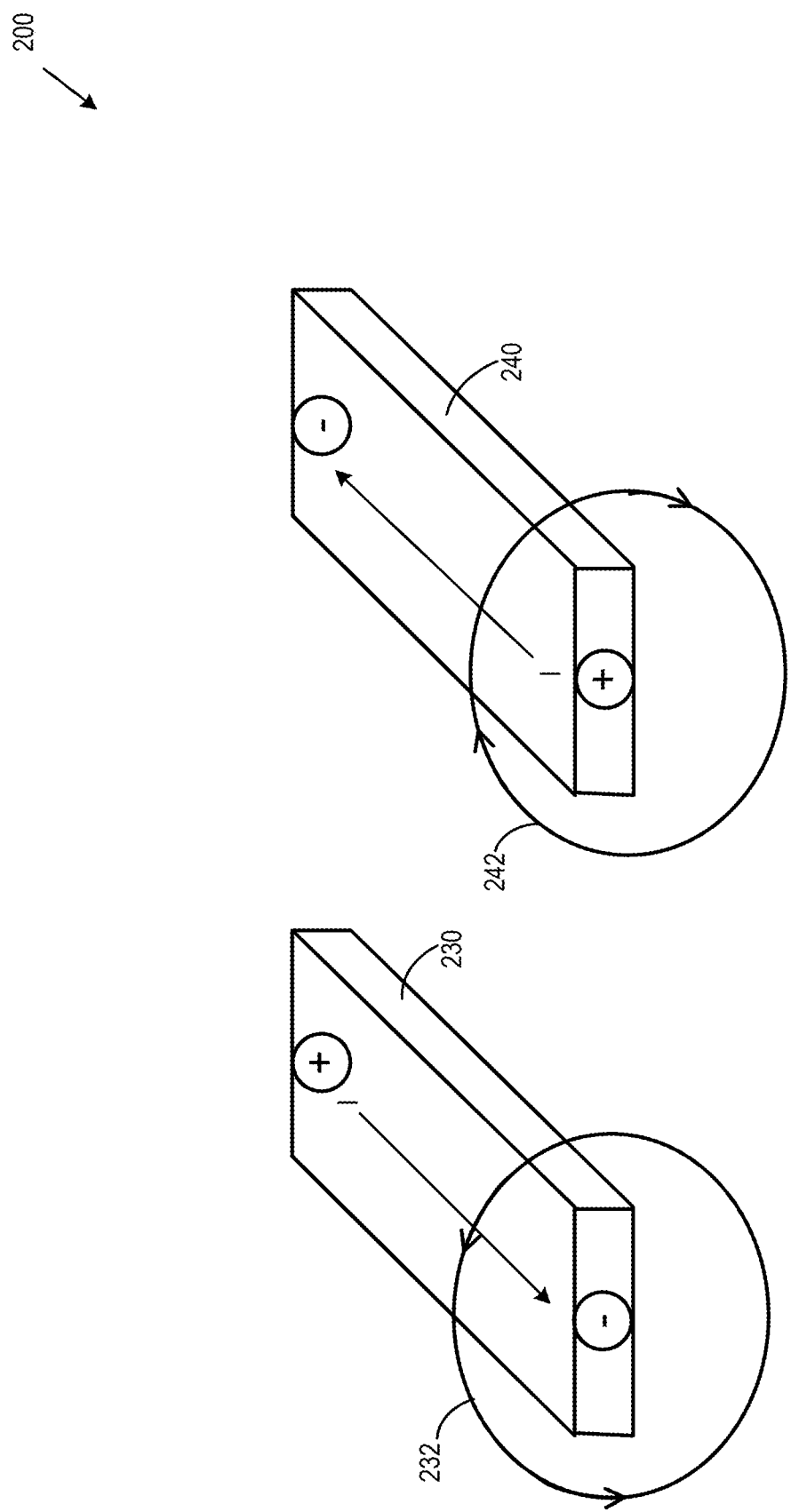
FIG. 2 is a simplified perspective view of a pair of electrical lines.

In operation, electrical current may flow into the capacitor 100 through the first capacitor terminal 102, and out of the capacitor 100 through the second capacitor terminal 104. Since coupled electrical lines of the capacitor 100 that are configured to carry antiparallel electrical currents are located in proximity to each other, electromagnetic coupling, known as mutual coupling, between the electrical lines occurs as the electrical current flows through the capacitor 100. This mutual coupling results from the magnetic fields from the two electrical lines carrying antiparallel currents. This mutual coupling may cancel some of the self-inductance of each trace or electrical line, reducing the total inductance of the capacitor 100. FIG. 2 illustrates the concept of mutual coupling.

Figure 4B:
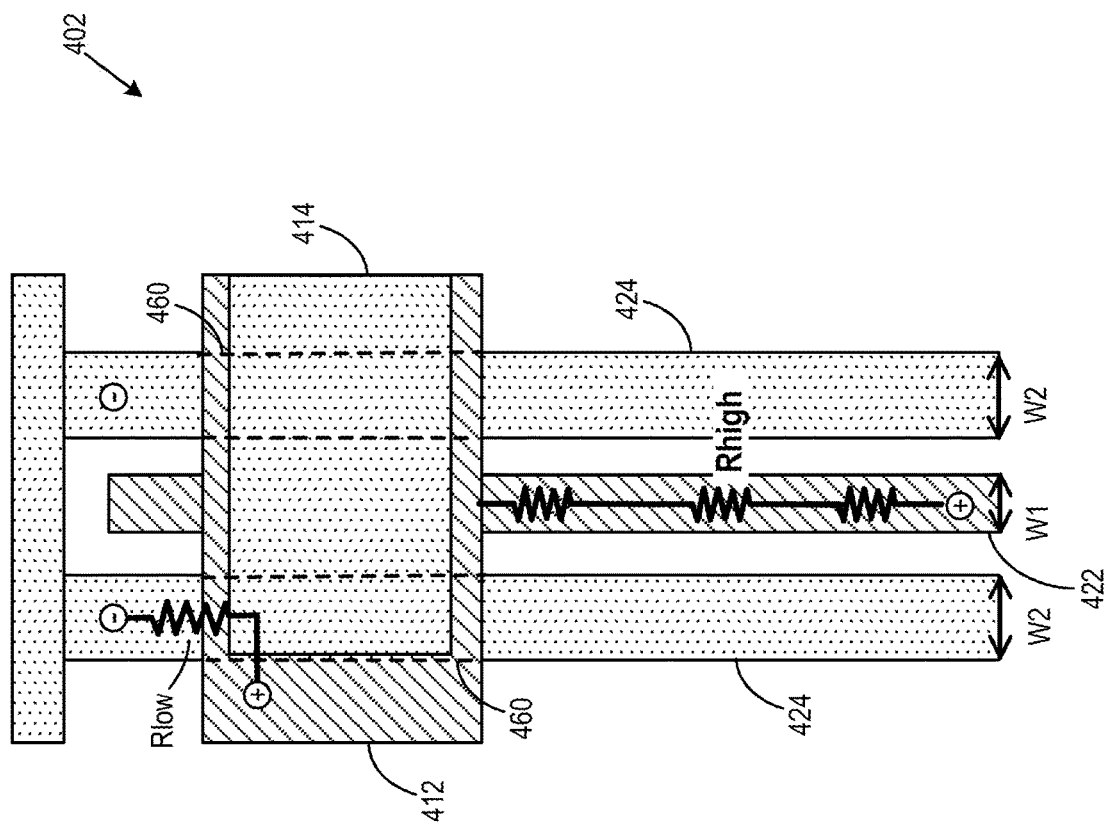

In some embodiments, a portion of the second plurality of finger elements 124 that is located in proximity to the first plate 112 are wider than a portion of the first plurality of finger elements 122 that are located in proximity to the first plate 112 (not shown, however, examples of wider finger elements are illustrated in FIGS. 4A, 4B, and 6). In such embodiments, the wider second plurality of finger elements 124 may increase a total capacitance of the capacitor 100 as compared to embodiments where a wider portion of the second plurality of finger elements 124 is not used. This increased total capacitance results from an increased capacitance between the second plurality of finger elements 124 and the first plate 112.

FIG. 2 is a simplified perspective view of a pair of electrical lines 200. The pair of electrical lines 200 includes a first line 230 and a second line 240. The first line 230 and the second line 240 may include transmission lines (e.g., conductive traces, etc.). When electrical current I is induced in opposite directions (sometimes referred to as anti-parallel currents or differentially driving) on the pair of electrical lines 200 (indicated using arrows and + and − signs), resulting magnetic fields 232 and 242 may be induced. If the first line 230 and the second line 240 are placed in proximity to each other, coupling between the first line 230 and the second line 240 occurs (because the magnetic field 232 produced by the first line 230 induces a current on the second line 240, and the magnetic field 242 produced by the second line 240 induces a current on the first line 230). This coupling is referred to herein as mutual coupling, and results in mutual inductance, which is indicated in equations herein as "M."

A self-inductance of each of the lines 230, 240 is indicated in equations herein as "L1." Assuming that the magnitude of the self-inductance and mutual inductance of each of the lines 230, 240 is the same, the inductance "L" of a loop including the lines 230, 240 is given by:

$$L = 2L1 - 2M$$

When the mutual inductance, and coupling, between the lines 230, 240 increases, the inductance L will be reduced and the lines will experience reduced inductance. By placing several capacitors next to each other and driving the lines with different polarity and anti-parallel currents, the inductance of the lines 230, 240 can be further reduced and a high capacitance can be achieved.

Figure 3A:
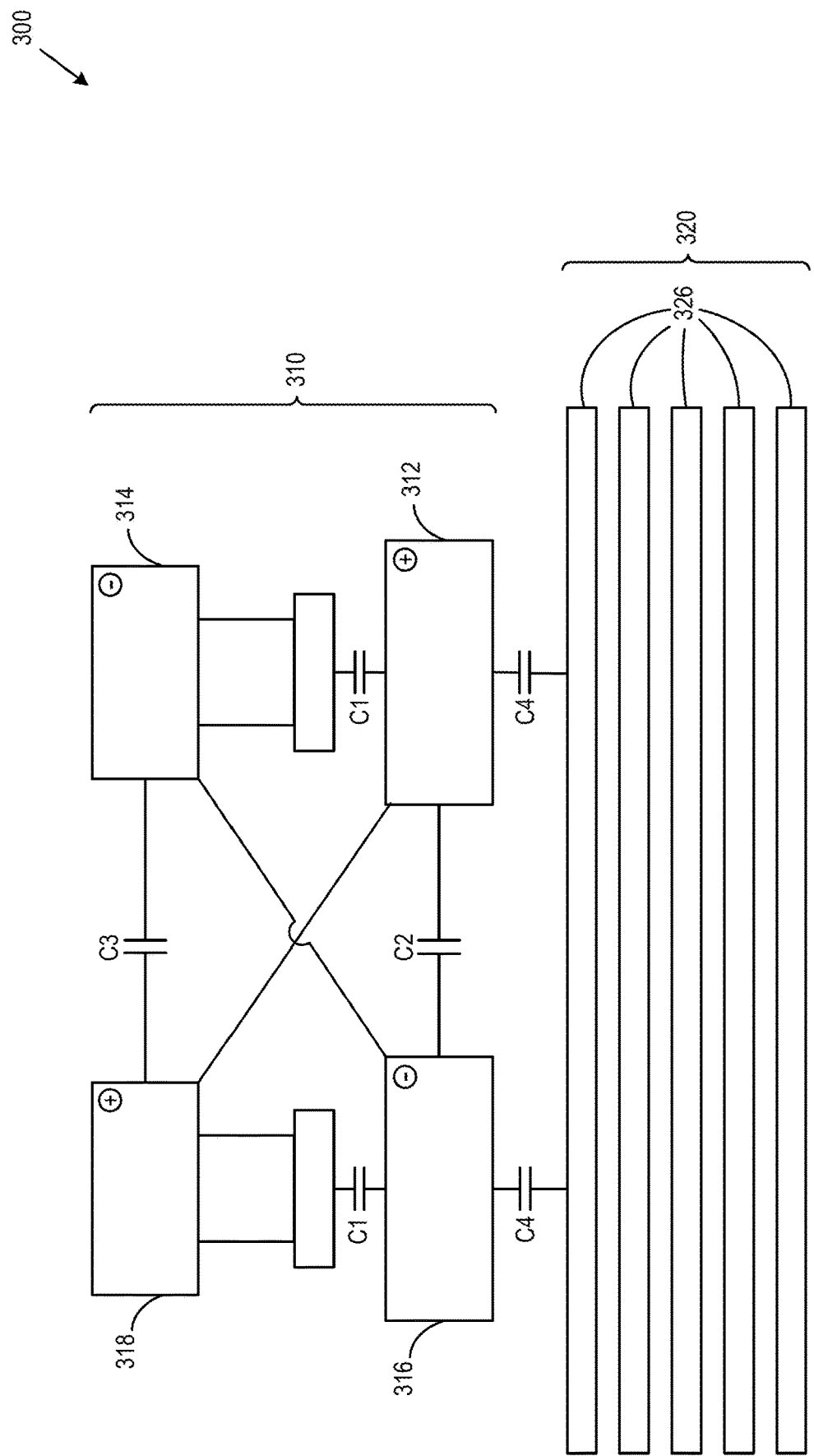
FIGS. 3A-3C are simplified views illustrating a capacitor according to some embodiments.
Figure 3B:
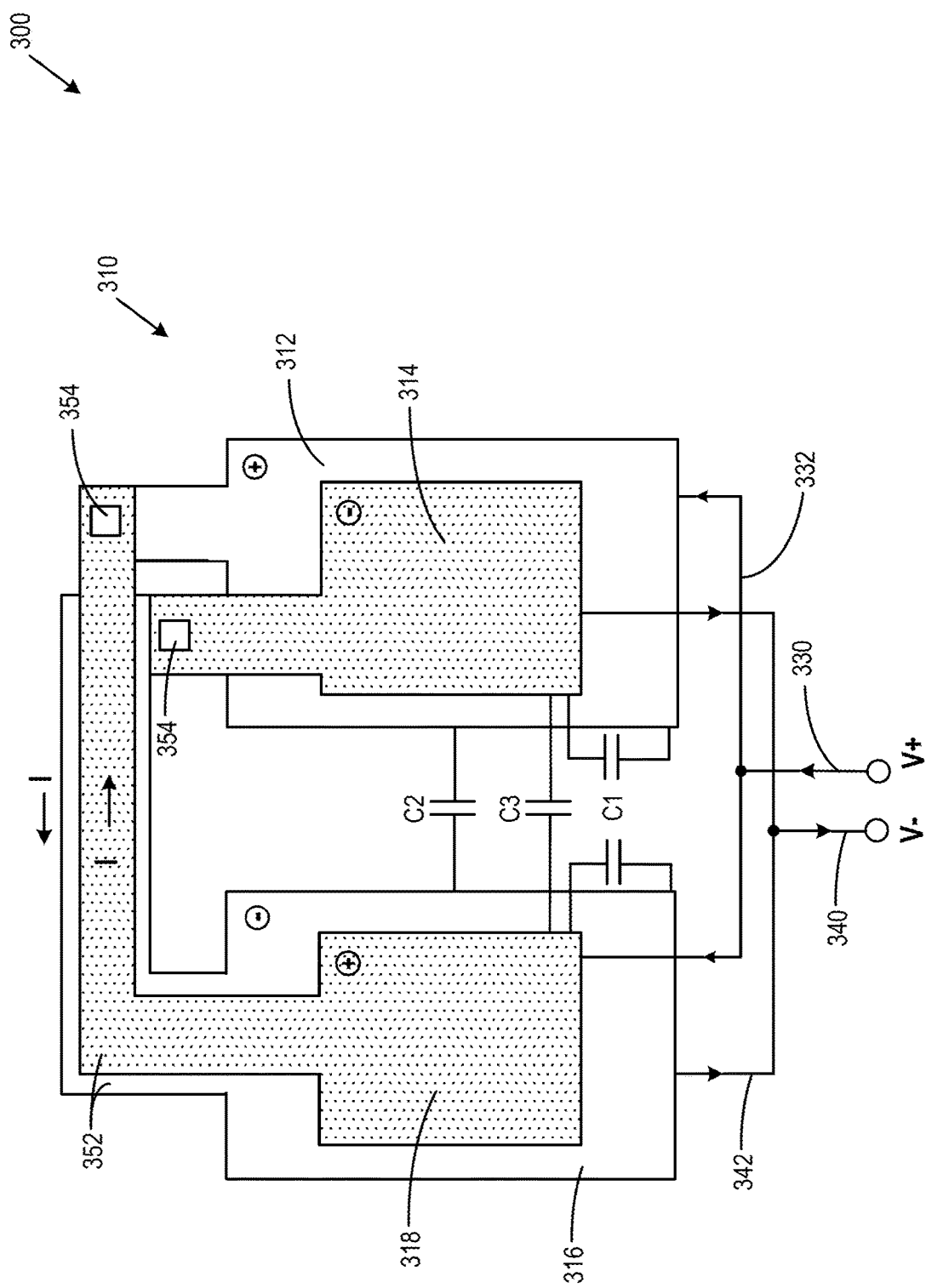
Figure 3C:
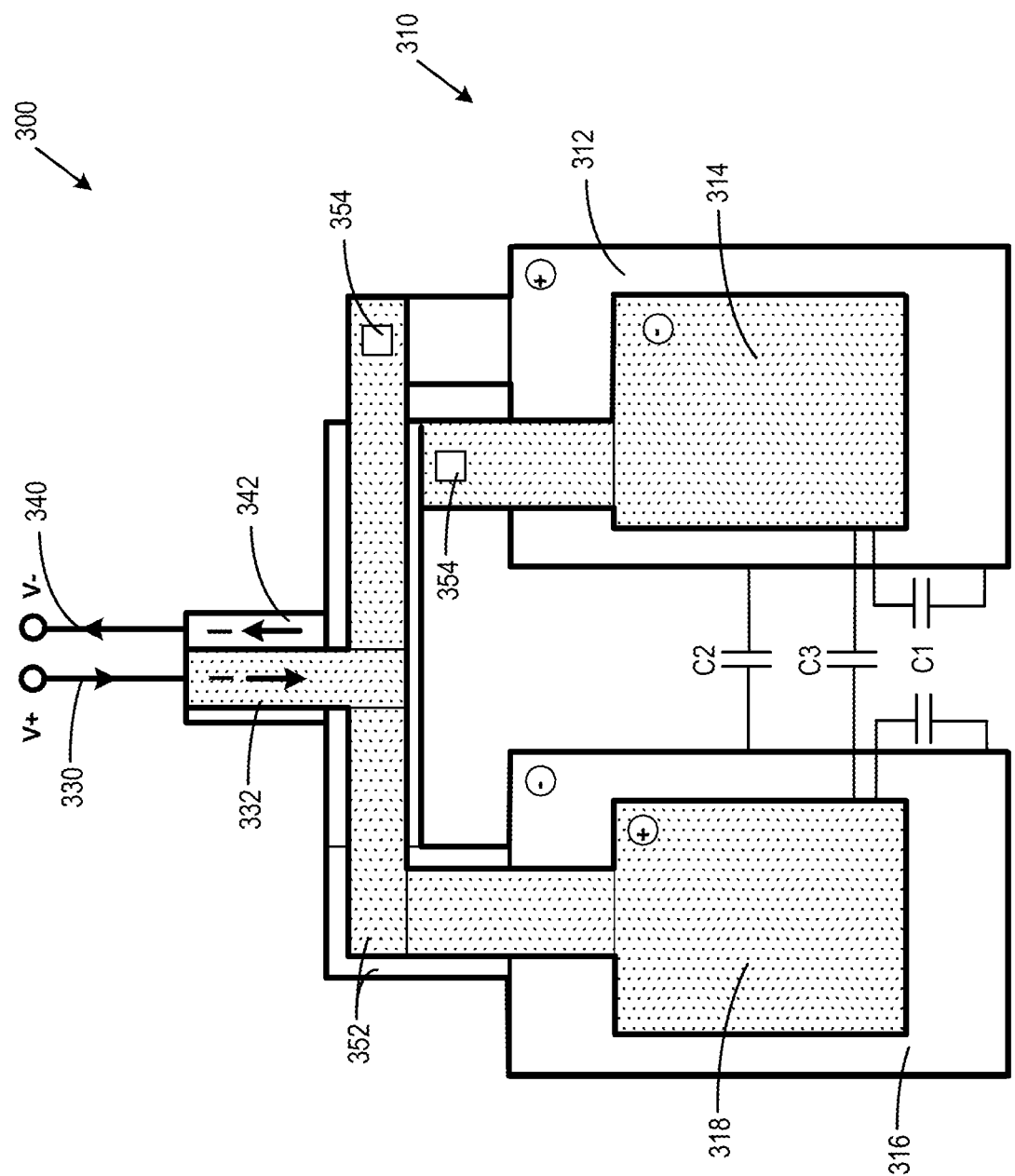

FIGS. 3A-3C are simplified views illustrating a capacitor 300 according to some embodiments. FIG. 3A is a simplified cross-sectional view of the capacitor 300. FIG. 3B is a simplified plan view of a plate-to-plate capacitor portion 310 (also referred to herein as "plate-to-plate portion" 310) of the capacitor 300. FIG. 3C is a simplified plan view of the plate-to-plate portion 310 of the capacitor 300 that is wired slightly differently than in FIG. 3B.

Referring to FIGS. 3A through 3C together, the capacitor 300 includes a plate-to-plate capacitor portion 310 and a finger-to-finger capacitor portion 320 (also referred to herein as "finger-to-finger portion" 320). The capacitor 300 also includes a first capacitor terminal 330 and a second capacitor terminal 340. The plate-to-plate capacitor portion 310 includes a first plate 312 electrically connected to the first capacitor terminal 330, a second plate 314 electrically connected to the second capacitor terminal 340, a third plate 316 electrically connected to the second capacitor terminal 340, and a fourth plate 318 electrically connected to the first capacitor terminal 330. The first plate 312, the second plate 314, the third plate 316, and the fourth plate 318 include electrically conductive material.

The second plate 314 is at least substantially parallel to the first plate 312 and offset from the first plate 312 in a direction at least substantially normal to the first plate 312. In other words, the second plate 314 is vertically offset from the first plate 312. The third plate 316 is at least substantially coplanar with the first plate 312 (e.g., formed from the same metal layer) and offset from the first plate 312 in an at least substantially parallel direction from the first plate 312 (e.g., horizontally). The fourth plate 318 is at least substantially coplanar with the second plate 314 (e.g., formed from the same metal layer) and offset from the second plate 314 in a substantially parallel direction from the second plate 314 (e.g., horizontally). The fourth plate 318 is at least substantially parallel to the third plate 316 and offset from the third plate 316 in a direction at least substantially normal to the third plate 316. In other words, the fourth plate 318 is offset vertically from the third plate 316.

In some embodiments, the first plate 312 and the third plate 316 may be formed from the same metal layer in a substrate (e.g., a semiconductor substrate), and the second plate 314 and the fourth plate 318 may be formed in a metal layer offset from the metal layer of the first plate 312 and the third plate 316.

In this configuration, when a voltage potential v+, v− is applied across the first capacitor terminal 330 and the second capacitor terminal 340, antiparallel currents (indicated in part by I+ and I−) are induced on the plates 312, 314, 316, and 318 relative to others of the plates 312, 314, 316, and 318 in the same vicinity. As a result, mutual coupling between the plates 312, 314, 316, and 318, as discussed above with reference to FIG. 2, may decrease the total inductance of the plate-to-plate portion 310 of the capacitor 300.

The finger-to-finger portion 320 includes one or more layers 326. Each layer 326 of the finger-to-finger portion 320 includes a first plurality of finger elements and a second plurality of finger elements interleaved with the first plurality of finger elements (e.g., a plan view of each layer 326 of the finger-to-finger portion 320 may be similar to the finger-to-finger capacitor 120 illustrated in FIG. 1). The first plurality of finger elements and the second plurality of finger elements include electrically conductive material. Individual ones of the first plurality of finger elements are electrically connected to the first capacitor terminal 330, and individual ones of the second plurality of finger elements are electrically connected to the second capacitor terminal 340.

In some embodiments, at least a portion of the second plurality of finger elements in a top layer 326 of the finger-to-finger portion 320 is located in proximity to the first plate 312 to induce capacitive coupling between the first plate 312 and the second plurality of finger elements. This capacitive coupling may occur responsive to a voltage potential difference v+, v− applied across the first capacitor terminal 330 and the second capacitor terminal 340. In some embodiments, the portion of the second plurality of finger elements that is located in proximity to the first plate 312 may be wider than a portion of the first plurality of finger elements that is located in proximity to the first plate 312.

In some embodiments, at least a portion of the first plurality of finger elements is located in proximity to the third plate 316 to induce capacitive coupling between the third plate 316 and the first plurality of finger elements. This capacitive coupling may occur responsive to the voltage potential difference v+, v− applied across the first capacitor terminal 330 and the second capacitor terminal 340. In some embodiments, the portion of the first plurality of finger elements that is located in proximity to the third plate 316 is wider than a portion of the second plurality of finger elements that is located in proximity to the third plate 316.

In embodiments where only a single layer 326 of finger elements is included, each of the first plurality of finger elements and each of the second plurality of finger elements may be arranged in a substantially coplanar arrangement (e.g., be formed from a single metal layer).

In embodiments where multiple layers 326 of finger elements are included, some of the first plurality of finger elements and some of the second plurality of finger elements may be arranged in each one of the layers 326 (e.g., multiple metal layers). In some embodiments, the pattern of the first plurality of finger elements and the second plurality of finger elements may alternate every other layer 326 so that the first plurality of finger elements function as plate-to-plate capacitors with similarly positioned ones of the second plurality of finger elements in adjacent layers 326.

In some embodiments, each one of the layers 326 may be offset from the first plate 312 and the third plate 316 by a different offset distance (e.g., in uniform distance increments, in non-uniform distance increments, or combinations thereof).

In some embodiments, a density of capacitance of the plate-to-plate portion 310 of the capacitor 300 alone may, for example, be about 0.2 femtofarads per square micron (fF/μm²), 0.5 fF/μm², or 1.0 fF/μm². In some embodiments, however, any other type capacitor may be used instead of the plate-to-plate portion 310 and may be located near the finger-to-finger portion 320.

By driving the capacitor terminals 330, 340 differentially so that the currents in the capacitor 300 are antiparallel (e.g., the currents in the first plate 312 and the second plate 314 are antiparallel, the currents in the third plate 316 and the fourth plate 318 are antiparallel, the currents in the first plate 312 and the third plate 316 are antiparallel, the currents in the second plate 314 and the fourth plate 318 are antiparallel), the inductance in the interconnecting lines is reduced. As a result, inductance cancellation in the capacitor 300 may be improved (e.g., reduced and/or eliminated), and resonance frequency may be increased, thereby increasing the Q factor due to lower effective capacitance (capacitance may be increased by series inductance).

The orientation of the metal layers used to form the plate-to-plate portion 310 of the capacitor 300 may also contribute to creating additional capacitance between positive+ and negative− nets (e.g., between the plates 312, 314, 316, and 318) of the plate-to-plate portion 310. For example, a capacitance between the first plate 312 and the second plate 314 in addition to a capacitance between the third plate 316 and the fourth plate 318 is indicated in FIG. 3A as C1. A capacitance between the first plate 312 and the third plate 316 is indicated in FIG. 3A as C2. A capacitance between the second plate 314 and the fourth plate 318 is indicated in FIG. 3A as C3. The capacitance of just the plate-to-plate portion 310 would be the sum of C1, C2, and C3.

In implementing the proposed layout technique of the plate-to-plate portion 310, space is available to add additional capacitance under or over the plate-to-plate portion 310. For example, the finger-to-finger portion 320 may be implemented below the plate-to-plate portion 310, which includes a finger-to-finger intra-metal capacitor. It should be noted that in some embodiments, the finger-to-finger portion 320 may be implemented above the plate-to-plate portion 310 instead of or in addition to under the plate-to-plate portion 310. A density of capacitance of the finger-to-finger portion 320 alone may be about 1.2 fF/μm². As a result, the addition of the finger-to-finger portion 320 may increase the total capacitance of the capacitor 300 by the capacitance of the finger-to-finger portion 320. Furthermore, additional capacitance may be realized between the plate-to-plate portion 310 and the finger-to-finger portion 320, which is indicated in FIG. 3A as C4. Therefore, capacitances C1, C2, C3, C4, and the capacitance of the finger-to-finger portion 320 may contribute to the total capacitance of the capacitor 300.

FIGS. 3B and 3C illustrate, from plan views, two examples of how the positive+ and negative− nets may be connected via interconnects (e.g., traces 352 and vias 354). For example, the interconnects 352, 354 may electrically connect the first plate 312 to the fourth plate 318, and the second plate 314 to the third plate 316. Also, additional capacitance and inductance canceling may be achieved using the traces 352.

Figure 4C:
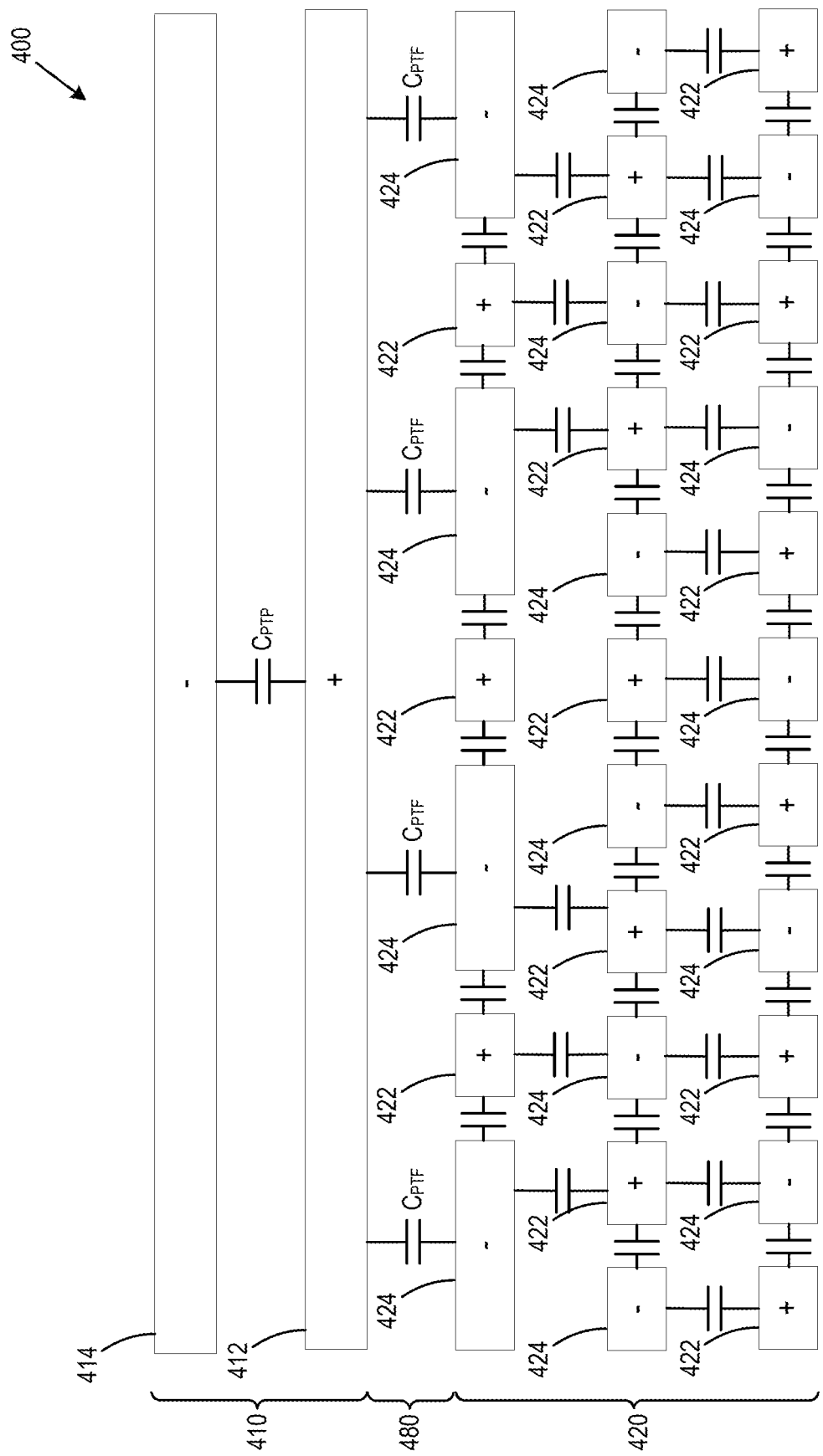

FIGS. 4A-4C are simplified views of a capacitor 400, according to some embodiments. FIG. 4A is a simplified plan view of the capacitor 400. FIG. 4B is a simplified, zoomed-in plan view of a portion 402 of the capacitor 400. FIG. 4C is a simplified cross-sectional view of the capacitor 400. Referring to FIGS. 4A-4C together, the capacitor 400 includes a plate-to-plate portion 410 (FIG. 4C illustrates a plate-to-plate capacitance $C_{PTP}$; capacitance between the first plate 412 and the second plate 414, and between the third plate 416 and the fourth plate 418 contribute to $C_{PTP}$) and a finger-to-finger portion 420 (FIG. 4C illustrates unlabeled capacitors between finger elements 422, 424, which contribute to the finger-to-finger capacitance) similar to the plate-to-plate portion 310 and finger-to-finger portion 320 discussed above with reference to FIGS. 3A-3C. The capacitor 400 also includes a first capacitor terminal 430 and a second capacitor terminal 440, similar to the first capacitor terminal 330 and the second capacitor terminal 340 of FIG. 3A. FIG. 4C also illustrates a plate-to-finger portion 480, which includes a plate-to-finger capacitance $C_{PTF}$ (capacitance between the first plate 412 and the second plurality of finger elements 424 and between the third plate 416 and the first plurality of finger elements 422 contribute to $C_{PTF}$). The plate-to-plate portion 410 includes a first plate 412, a second plate 414, a third plate 416, and a fourth plate 418 configured similarly to the first plate 312, the second plate 314, the third plate 316, and the fourth plate 318 discussed above with reference to FIG. 3. In other words, the plate-to-plate portion 410 is configured for antiparallel currents as discussed above. The finger-to-finger portion 420 includes a first plurality of finger elements 422 interleaved with a second plurality of finger elements 424. FIG. 4B illustrates how positive and negative nets +, − are connected. FIG. 4C illustrates that the first plurality of finger elements 422 and the second plurality of finger elements 424 may be distributed in one or more layers of finger elements.

In some embodiments, parts of individual ones of the second plurality of finger elements 424 that are in proximity to the first plate 412 may be wider than parts of individual ones of the first plurality of finger elements 422 that are in proximity to the first plate 412. As illustrated in FIG. 4B, a first width w1 of first finger element 422 is less than a second width w2 of the second finger elements 424. As a result, resistance in these parts of the second plurality of finger elements 424 may be less than that of these parts of the first plurality of finger elements 422. Similarly, parts of individual ones of the first plurality of finger elements 422 that are in proximity to the third plate 416 may be wider than parts of individual ones of the second plurality of finger elements 424 that are in proximity to the third plate 416.

Since the finger elements 422, 424 have series resistance, it is beneficial to have wider traces in the finger elements 422, 424 of the finger-to-finger portion 420. The resistance between the plate-to-plate portion 410 and the finger-to-finger portion 420 is inversely proportional to an area of overlap 460 between finger elements 422, 424 of opposing polarities to the first plate 412 and the second plate 414 (e.g., R∼1/(Area overlap)∼1/(finger width)).

Also, the capacitance between the first plate 412 and the second plurality of finger elements 424 (illustrated as $C_{PTF}$ in FIG. 4C) may be greater if the width w2 of the second plurality of finger elements 424 is greater in the vicinity of the first plate 412 (the resulting C4 of FIG. 3A is greater). This capacitance between the first plate 412 and the second plurality of finger elements 424 $C_{PTF}$ is proportional to the area of overlap 460 between the first plate 412 and the second plurality of finger elements 424. Similarly, the capacitance between the third plate 416 and the first plurality of finger elements 422 (also contributing to $C_{PTF}$) may be greater if the width of the first plurality of finger elements is greater in the vicinity of the third plate 416 (the resulting C4 of FIG. 3A is greater). This capacitance between the third plate 416 and the first plurality of finger elements 422 is proportional to the area of overlap between the third plate 416 and the first plurality of finger elements 422.

Relatively wider traces in a metal layer of the first plate 412 and third plate 416 and a metal layer of the finger-to-finger portion 420 also increases the capacitance between the positive+ and negative− nets as compared to relatively narrower traces. This is illustrated in FIG. 4B where the negative nets− of the second plurality of finger elements 424 are located near the bottom of the first plate 412. Since the positive net+ of the first finger element 422 has no additional capacitance to the first plate 412, the first finger element 422 may be narrower than the second finger elements 424 in this region near the first plate 412. Similarly, since the negative nets− have additional capacitance to the first plate 412, the second finger elements 424 may be wider than the first finger element 422 in this region near the first plate 412 to improve the quality factor of the capacitance, which is given by $Q=1/(2*\pi*f*R*C)$ (where f is the frequency of operation).

Figures 5A, 5B:
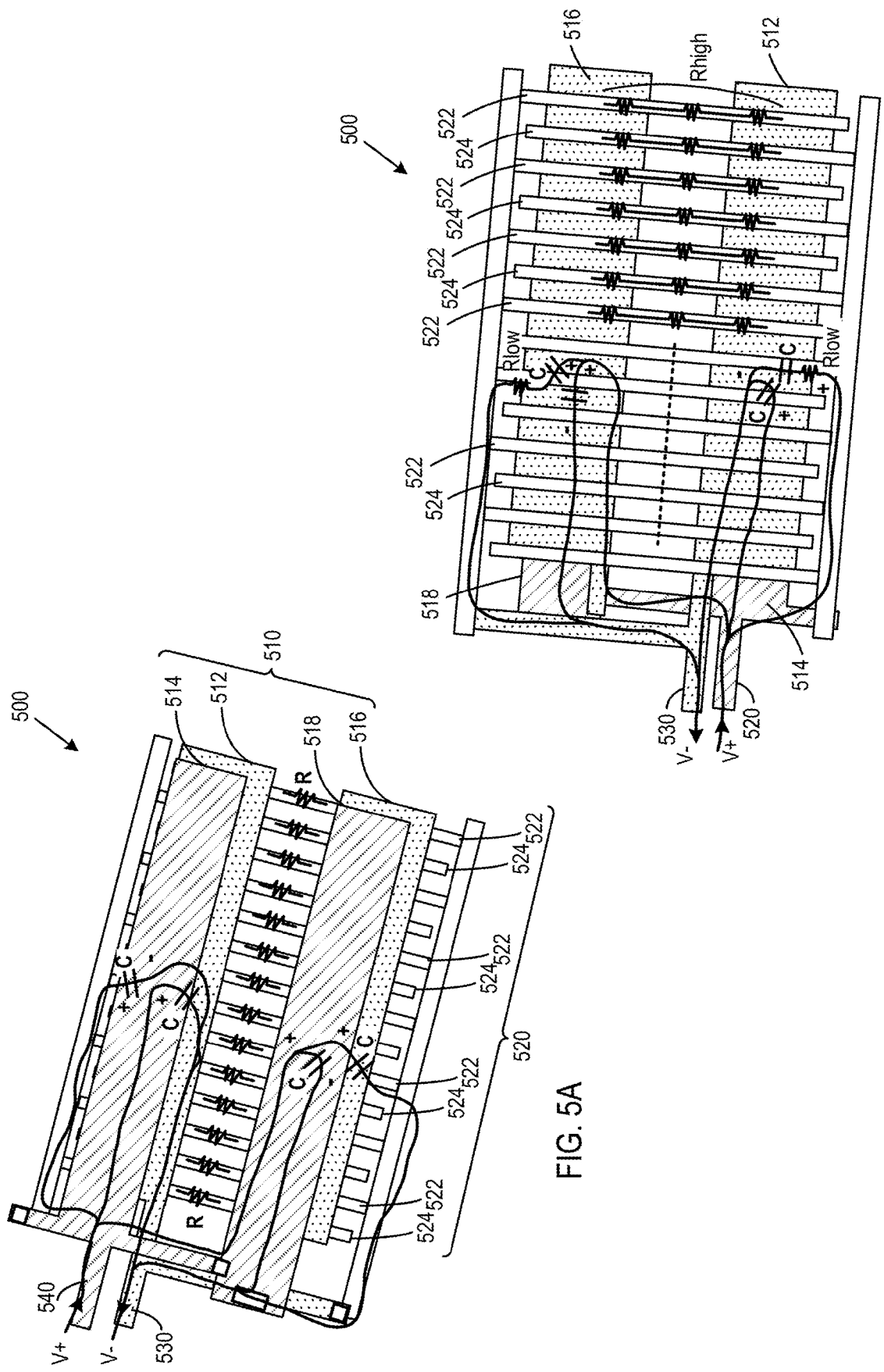
FIGS. 5A and 5B are a top view and a bottom view, respectively, of a capacitor, according to some embodiments.

FIGS. 5A and 5B are a top view and a bottom view, respectively, of a capacitor 500, according to some embodiments. The capacitor 500 includes a first capacitor terminal 530, a second capacitor terminal 540, a plate-to-plate portion 510, and a finger-to-finger portion 520 similar to the first capacitor terminal 430, the second capacitor terminal 440, the plate-to-plate portion 410, and the finger-to-finger portion 420 discussed above with reference to FIGS. 4A-4B. The plate-to-plate portion 510 includes a first plate 512 and a fourth plate 518 electrically connected to the first capacitor terminal 530 and a second plate 514 and a third plate 516 electrically connected to the second capacitor terminal 540. The finger-to-finger portion 520 includes a first plurality of finger elements 522 and a second plurality of finger elements 524 interleaved with the first plurality of finger elements 522.

Improvement (e.g., optimization) of the Q-factor of the capacitor 500 is further illustrated in FIGS. 5A and 5B, which indicate capacitive coupling C between and resistances R, Rhigh, and Rlow of structures of the capacitor 500. For example, relatively large resistance R, Rhigh is associated with parts of the finger elements 522, 524 that are relatively further away from the first plate 512 and the third plate 516. These parts may be omitted by the proposed structure, in some embodiments. The arrows indicate the direction of the current.

Figure 6A:
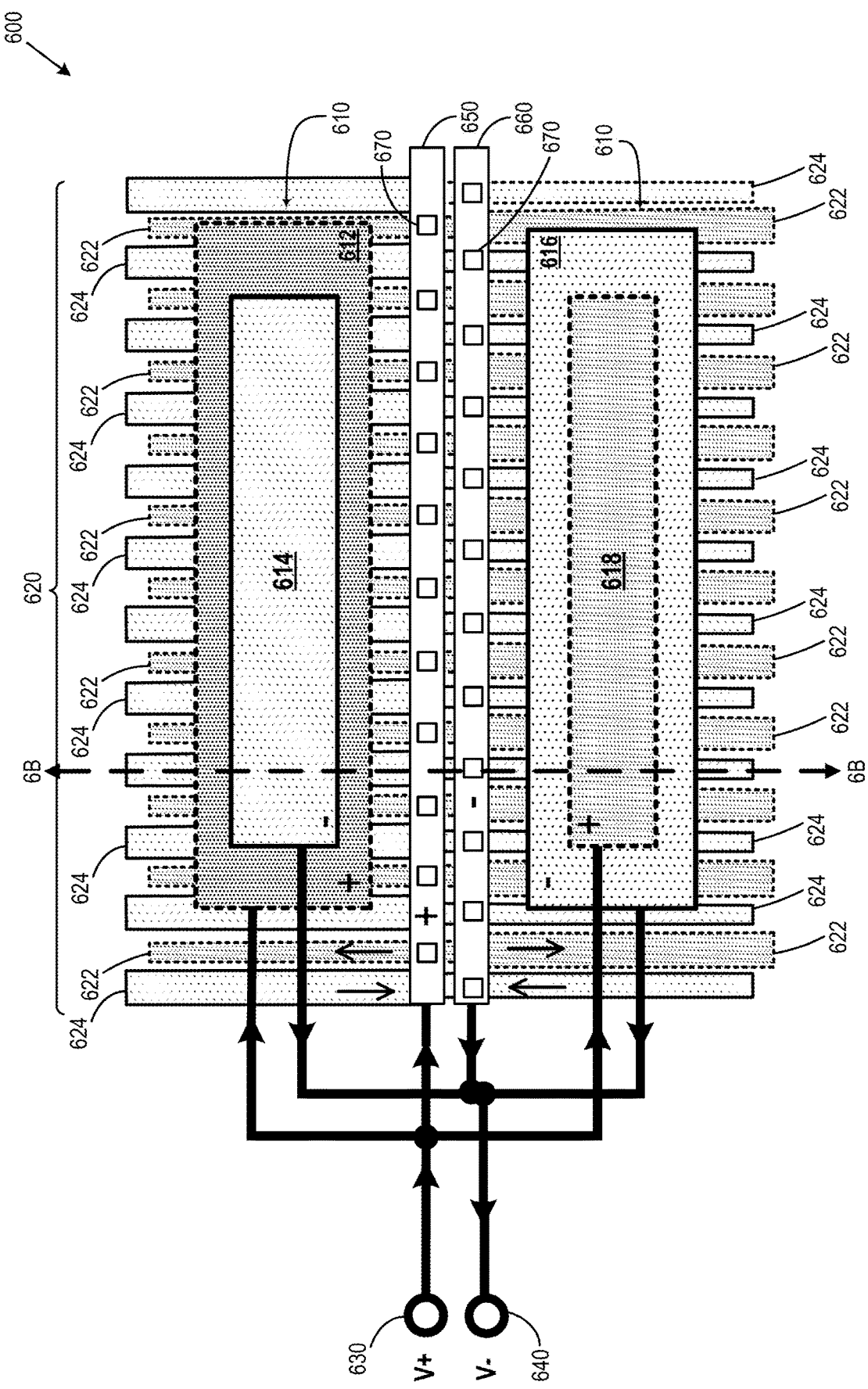
FIGS. 6A-6D are simplified views of a capacitor according to some embodiments.
Figure 6B:
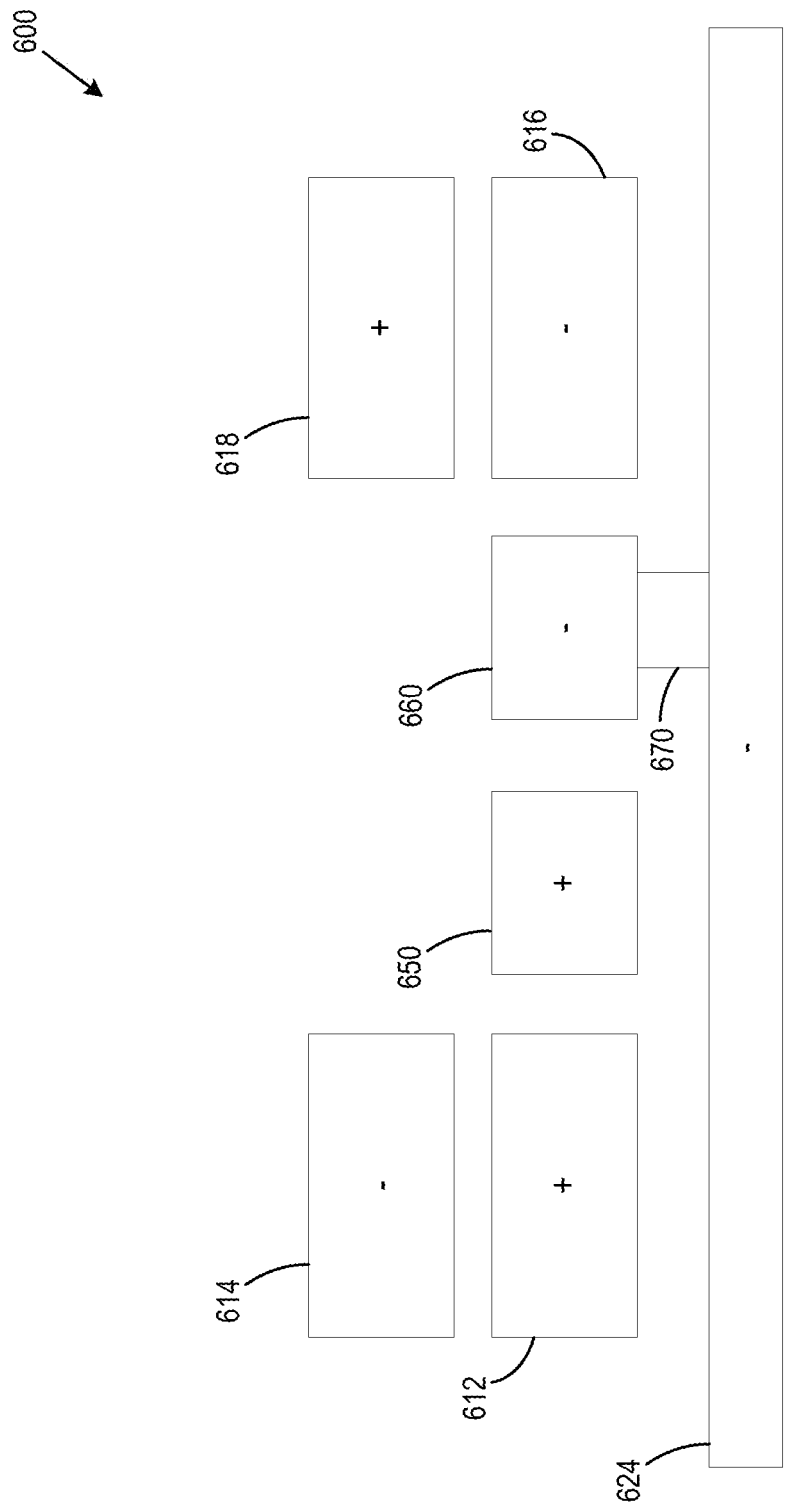
Figure 6C:
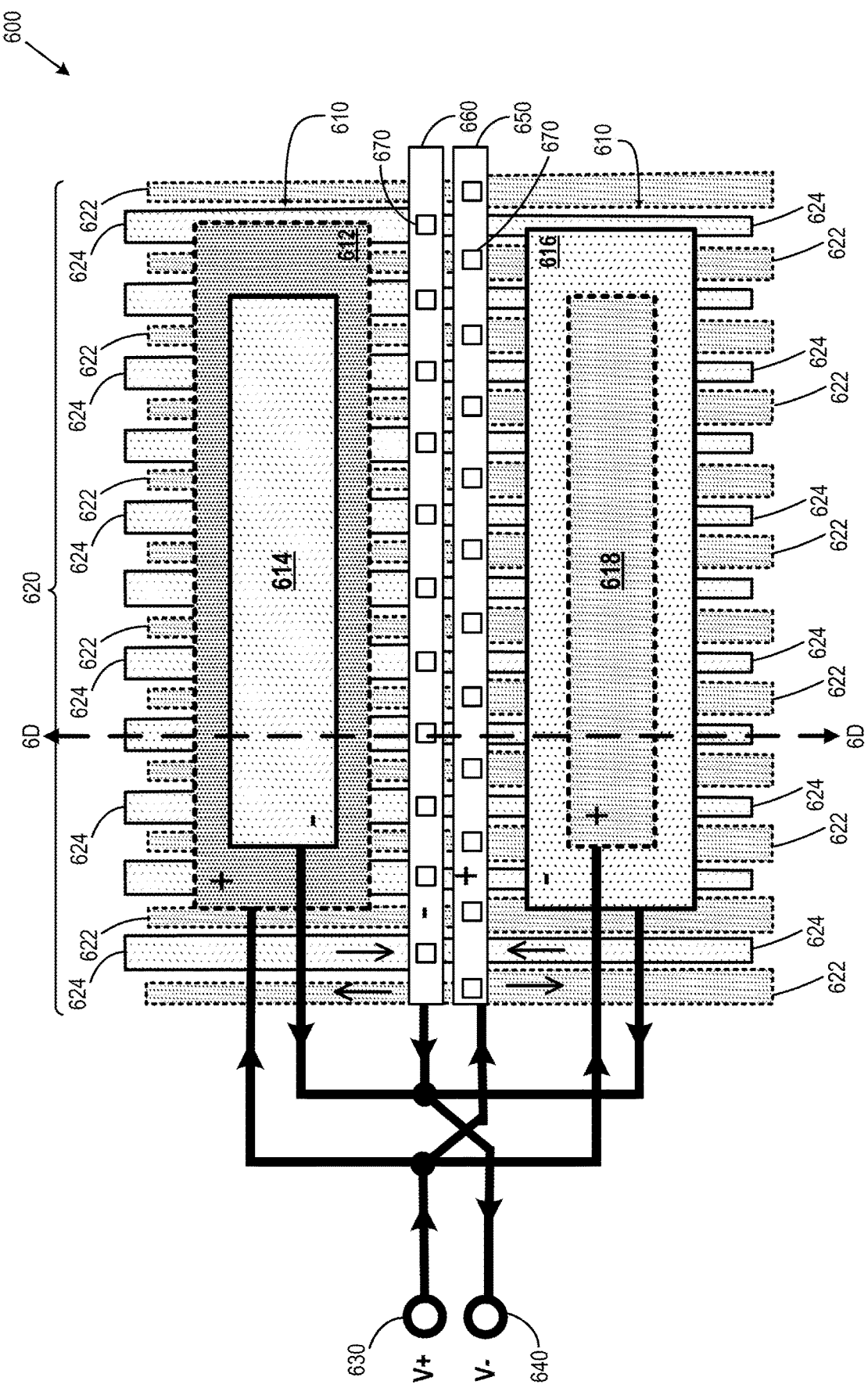
Figure 6D:
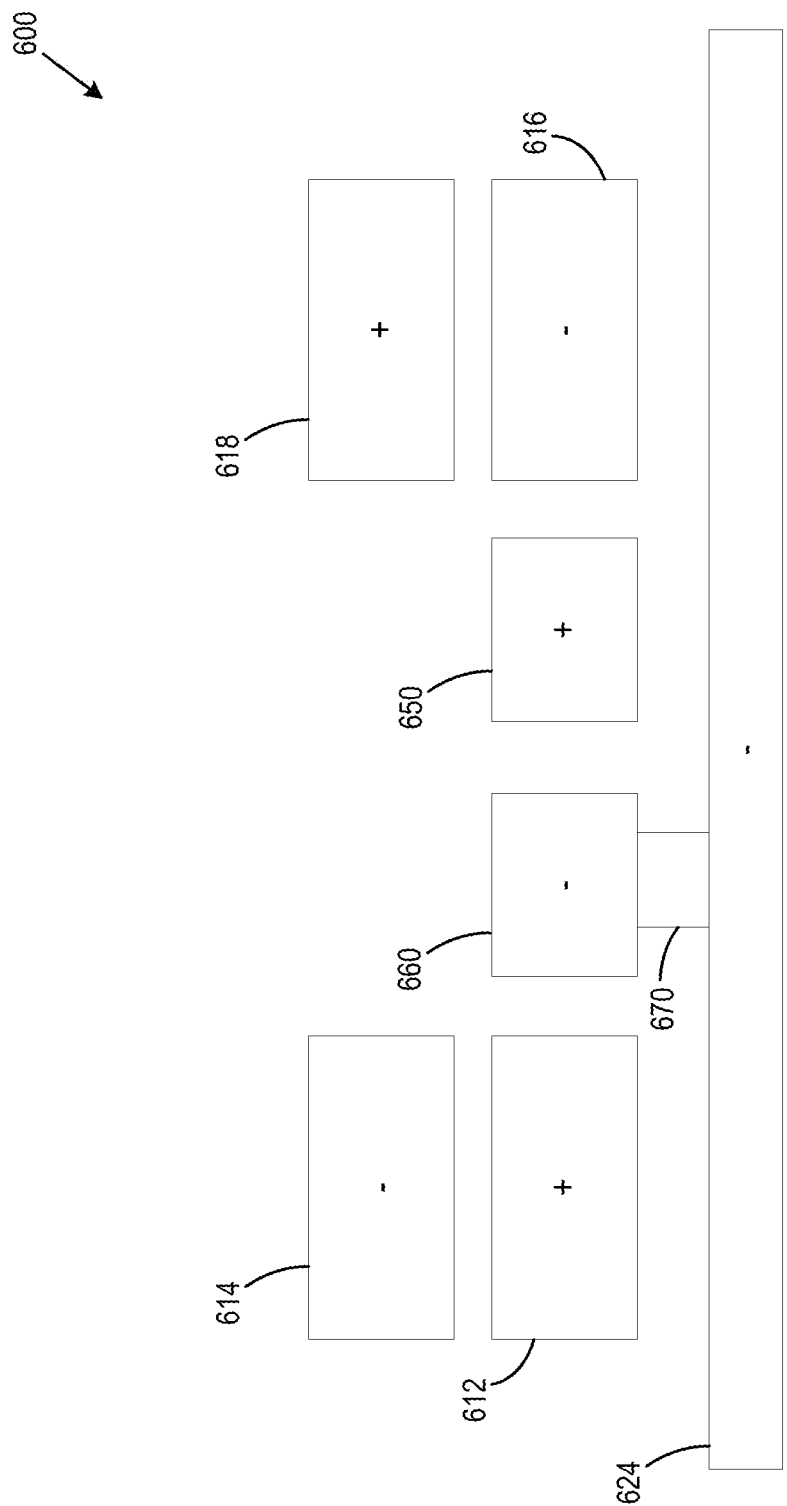

FIGS. 6A-6D are simplified views of a capacitor 600 according to some embodiments. FIG. 6A is a simplified plan view of the capacitor 600. FIG. 6B is a simplified cross-sectional view of the capacitor 600 taken along line 6B of FIG. 6A. FIG. 6C is a simplified plan view of the capacitor 600 of FIGS. 6A and 6B accept that connections to various elements in FIG. 6C are different from those of 6A and 6B, resulting in different directions of current shown in FIG. 6C as compared to that of FIG. 6A. FIG. 6D is a simplified cross-sectional view of the capacitor 600 of FIG. 6C taken along line 6D of FIG. 6C.

The capacitor 600 includes a first capacitor terminal 630, a second capacitor terminal 640, and a plate-to-plate portion 610 including a first plate 612, a second plate 614, a third plate 616, and a fourth plate 618 similar to the first capacitor terminal 430, the second capacitor terminal 440, and the plate-to-plate portion 410 including the first plate 412, the second plate 414, the third plate 416, and the fourth plate 418 discussed above with reference to FIGS. 4A-4B. The capacitor 600 also includes a finger-to-finger portion 620 in proximity to the plate-to-plate portion 610. The finger-to-finger portion 620 includes a first plurality of finger elements 622 and a second plurality of finger elements 624 interleaved with the first plurality of finger elements 622. The capacitor 600 further includes a first transmission line 650 configured to electrically connect the first capacitor terminal 630 to the first plurality of finger elements 622, and a second transmission line 660 configured to electrically connect the second capacitor terminal 640 to the second plurality of finger elements 624.

In this configuration (the finger elements 622, 624 being center-fed by the first transmission line 650 and the second transmission line 660), the finger-to-finger portion 620 has inductance cancellation in the finger elements 622, 624 and in the transmission lines 650, 660. Accordingly, both the finger-to-finger portion 620 and the plate-to-plate portion 610 have inductance cancellation. This arrangement also optionally may use different finger widths as discussed in FIGS. 4A and 4B to increase the capacitance and enhance the quality factor by reduced resistance. Arrows illustrated on the finger elements 622, 624 of FIGS. 6A and 6C indicate the direction of the current responsive to a positive voltage potential v+, v− being applied across the first capacitor terminal 630 and the second capacitor terminal 640. Since these currents are anti-parallel for adjacent finger elements 622, 624 the inductance is cancelled due to mutual coupling. Moreover, the inductance in interconnects 650, 660 for the plate-to-plate portion 610 is also cancelled, as discussed above with reference to FIGS. 3A-3C.

In some embodiments, the first transmission line 650 and the second transmission line 660 may be at least substantially coplanar with the first plate 612 and the third plate 616 (e.g., formed from the same metal layer). FIGS. 6B and 6D illustrate examples of the first transmission line 650 and the second transmission line 660 being located coplanar with the first plate 612 and the third plate 616. In such embodiments, vias 670 may be used to electrically connect the transmission lines 650, 660 to the finger elements 622, 624 (e.g., first vias electrically connecting the first transmission line 650 to the first plurality of finger elements 622, and second vias electrically connecting the second transmission line 660 to the second plurality of finger elements 624). These vias 670 may be used because the finger elements 622, 624 are offset vertically from the transmission lines 650, 660 (e.g., formed from a separate metal layer from that of the transmission lines 650, 660).

Figure 7A:
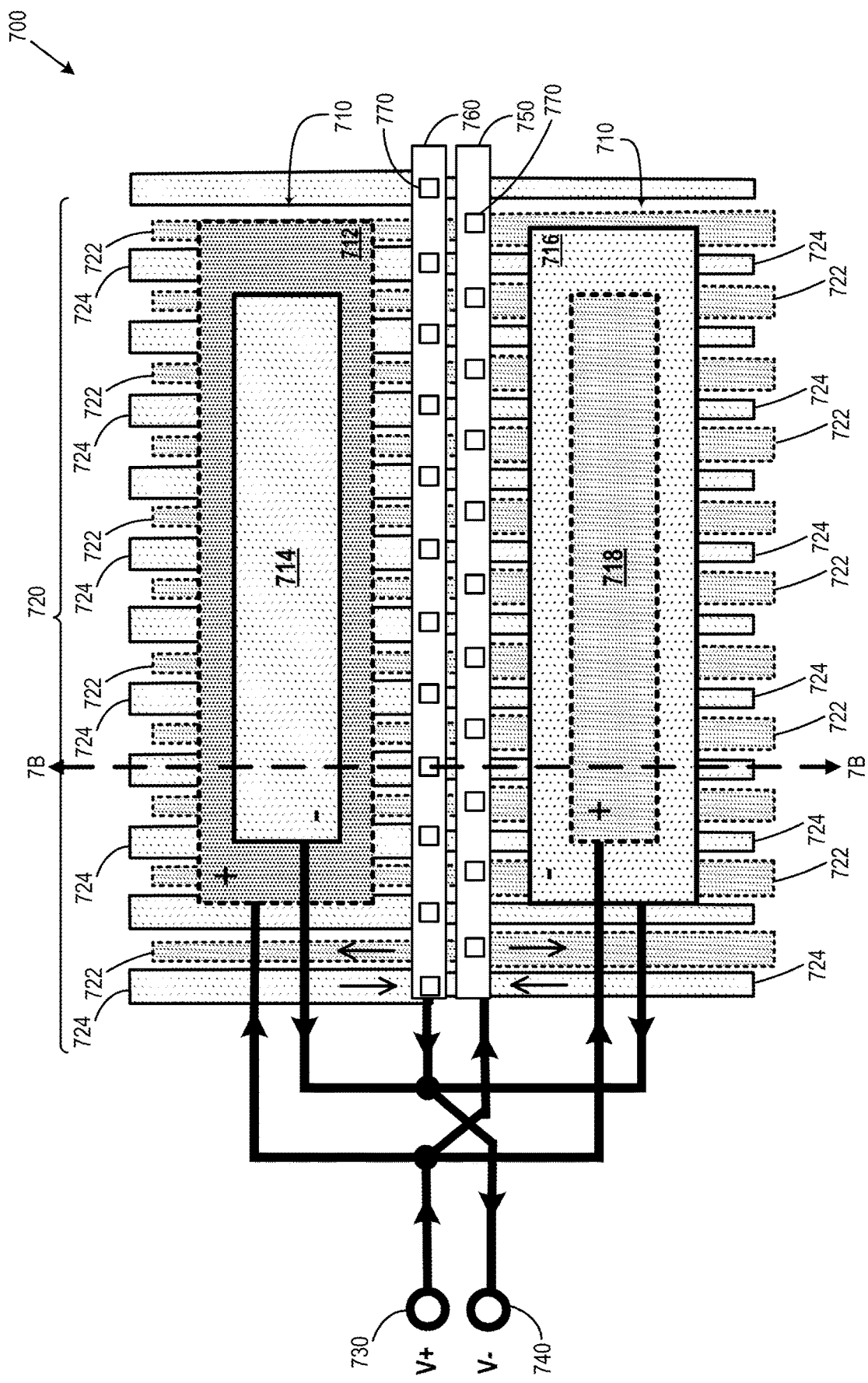
FIGS. 7A and 7B are simplified views of a capacitor, according to some embodiments.
Figure 7B:
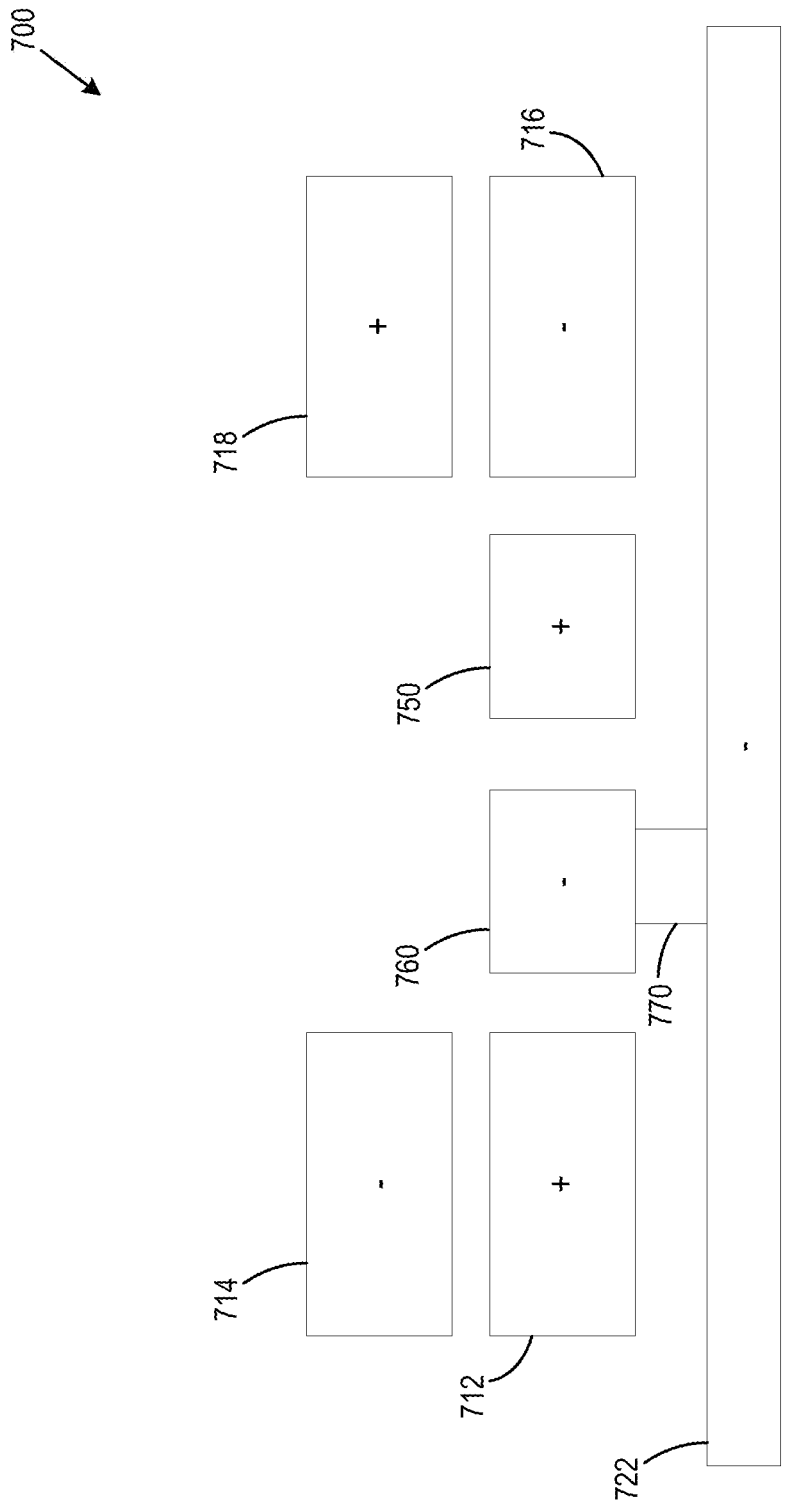

FIGS. 7A and 7B are simplified views of a capacitor 700, according to some embodiments. FIG. 7A is a simplified plan view of the capacitor 700. FIG. 7B is a simplified cross-sectional view of the capacitor 700 taken along line 7B of FIG. 7A.

The capacitor 700 includes a first capacitor terminal 730, a second capacitor terminal 740, and a plate-to-plate portion 710 including a first plate 712, a second plate 714, a third plate 716, and a fourth plate 718 similar to the first capacitor terminal 430, the second capacitor terminal 440, and the plate-to-plate portion 410 including the first plate 412, the second plate 414, the third plate 416, and the fourth plate 418 discussed above with reference to FIGS. 4A-4C. The capacitor 700 also includes a finger-to-finger portion 720 in proximity to the plate-to-plate portion 710. The finger-to-finger portion 720 includes a first plurality of finger elements 722 and a second plurality of finger elements 724 interleaved with the first plurality of finger elements 722. The capacitor 700 further includes a first transmission line 750 configured to electrically connect the first capacitor terminal 730 to the first plurality of finger elements 722, and a second transmission line 760 configured to electrically connect the second capacitor terminal 740 to the second plurality of finger elements 724.

Similar to the capacitor 600 of FIGS. 6A and 6B, the finger-to-finger portion 720 has inductance cancellation in the finger elements 722, 724 and in the transmission lines 750, 760. Accordingly, both the finger-to-finger portion 720 and the plate-to-plate portion 710 have inductance cancellation. This arrangement also optionally may use different finger widths as discussed in FIGS. 4A and 4B to increase the capacitance and enhance the quality factor by reduced resistance. Arrows illustrated on the finger elements 722, 724 of FIG. 7A indicate the direction of the current responsive to a positive voltage potential v+, v− being applied across the first capacitor terminal 730 and the second capacitor terminal 740. Since these currents are anti-parallel for adjacent finger elements 722, 724 the inductance is cancelled due to mutual coupling. Moreover, the inductance in interconnects 750, 760 for the plate-to-plate portion 710 is also cancelled, as discussed above with reference to FIGS. 3A-3C.

The capacitor 700, however, is different from the capacitor 600 of FIGS. 6A-6B because of positions of the transmission lines 750, 760 relative to the first plate 712 and the third plate 716. For example, the capacitor 600 of FIGS. 6A-6B includes the first transmission line 650 located between the second transmission line 660 and the first plate 612. In the capacitor 700 of FIGS. 7A and 7B there are antiparallel currents not just between the transmission lines 750, 760, but also between the transmission lines 750, 760 and the adjacent first plate 712 and third plate 716. As a result, inductance of the capacitor 700 may be slightly lower than that of the capacitor 600 of FIGS. 6A and 6B.

In some embodiments, the first transmission line 750 and the second transmission line 760 may be at least substantially coplanar with the first plate 712 and the third plate 716 (e.g., formed from the same metal layer). FIG. 7B illustrates an example of the first transmission line 750 and the second transmission line 660 being located coplanar with the first plate 712 and the third plate 616. In such embodiments, vias 770 may be used to electrically connect the transmission lines 750, 760 to the finger elements 722, 724, which may be offset vertically from the transmission lines 750, 760 (e.g., formed from a separate metal layer from that of the transmission lines 750, 760).

In some embodiments, the first transmission line 750 and the second transmission line 760 may be offset vertically from a position between the first plate 712 and the third plate 716 (e.g., formed from a different metal layer than the first plate 712 and the third plate 716). Similarly, the first transmission line 650 and the second transmission line 660 of the capacitor 600 may be offset vertically from a position between the first plate 612 and the third plate 616.

Figure 8:
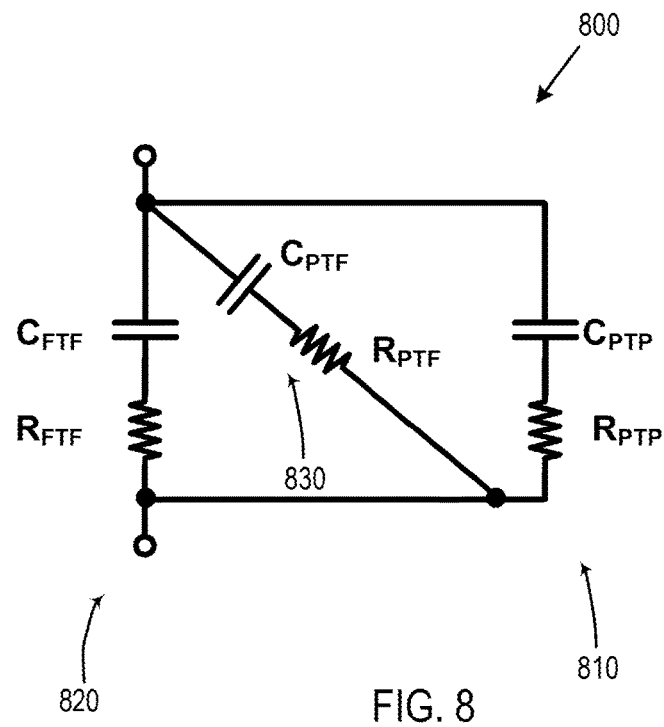
FIG. 8 is a simplified illustration of an equivalent circuit for capacitors (e.g., the capacitors of FIGS. 1, 3A-3C, 4A-4C, 5A and 5B, 6A-6D, or 7A and 7B) disclosed herein.

FIG. 8 is a simplified illustration of an equivalent circuit 800 for capacitors (e.g., capacitors 100, 300, 400, 500, 600, and 700) disclosed herein. FIG. 8 highlights the property of the Q factor, which is given generally as:

$$Q = \frac{1}{\omega RC},$$

where $\omega$ is an operational frequency of the capacitor, R is the resistance of the capacitor, and C is the capacitance of the capacitor. For the compound capacitors (e.g., capacitors 100, 300, 400, 500, 600, and 700) disclosed herein, however, a plate-to-plate portion and a finger-to-finger portion are connected in parallel. Accordingly, to properly model these capacitors, the equivalent circuit 800 includes a plate-to-plate portion 810 and a finger-to-finger portion 820 connected in parallel to each other. The plate-to-plate portion 810 includes a plate-to-plate capacitance $C_{ptp}$ connected in series with a plate-to-plate resistance $R_{ptp}$. The finger-to-finger portion 820 includes a finger-to-finger capacitance $C_{ftf}$ connected in series with a finger-to-finger resistance $R_{ftf}$.

The Q-factor for two parallel capacitors at mm-Wave frequencies, in our case one or more plate-to-plate capacitors (ptp) corresponding to the plate-to-plate portion 810 and one or more finger-to-finger capacitors (ftf) corresponding to the finger-to-finger portion 820 and one or more plate-to-finger capacitors (ptf) 830 (resulting from coupling between the plate-to-plate portion and the finger-to-finger portion), can be determined assuming that the total capacitance C from the equation above is given by $C=C_{ptp}+C_{ftf}+C_{ptf}$ and the total resistance R from the equation is given by $$\frac{1}{R} = \frac{1}{R_{ptp}} + \frac{1}{R_{ftf}} + \frac{1}{R_{ptf}}.$$

The overall Q factor $Q_{parallel}$, then, may be determined as follows:

$$Q_{parallel} = \frac{1}{\omega RC} = \frac{1}{\omega\left(\frac{R_{ftf}R_{ptp}R_{ptf}}{R_{ptp}R_{ptf} + R_{ftf}R_{ptf} + R_{ftf}R_{ptp}}\right)(C_{ftf} + C_{ptp} + C_{ptf})}.$$

Rather than achieving only a large capacitance C without reducing resistance R or improving the Q factor, which may be less useful for devices operating at very high frequencies (e.g., millimeter wave frequencies), a good Q factor may be obtained. Accordingly, using principles disclosed herein, a good Q factor may be achieved while a good balance between the capacitance C and minimizing the resistance, R, may be achieved.

Figure 9:
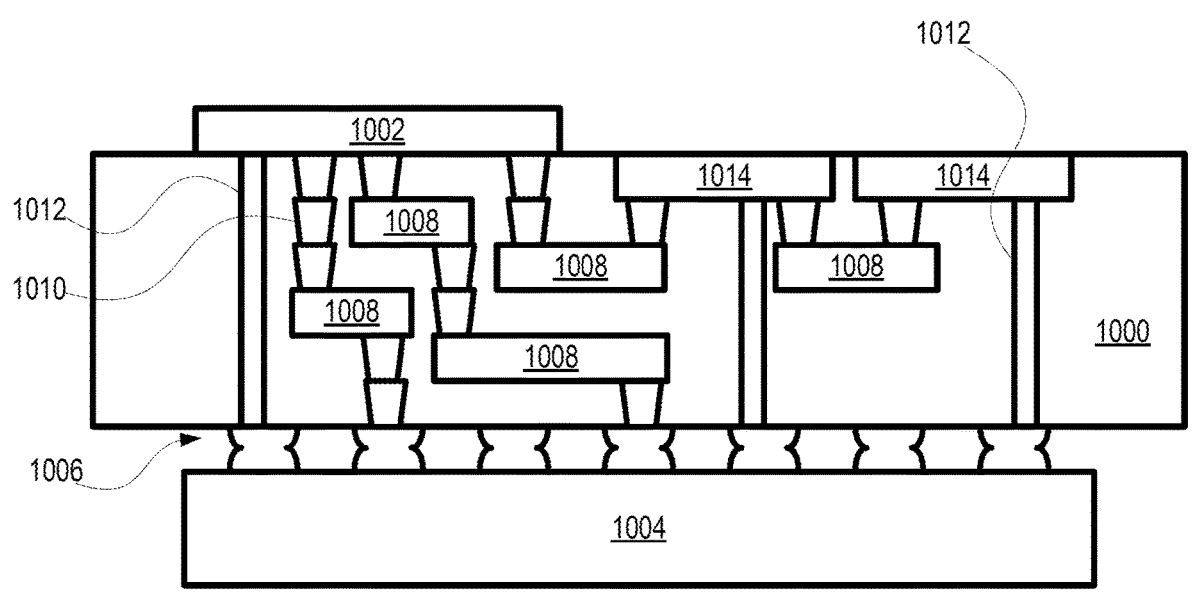
FIG. 9 illustrates an interposer that includes one or more embodiments of the disclosure.

FIG. 9 illustrates an interposer 1000 that includes one or more embodiments of the disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, a matching network to an antenna, an antenna array for beamforming, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide or liquid crystal polymer. In further implementations, the interposer may be formed of alternate rigid or flexible materials that may include the same materials described above for use in a semiconductor substrate, such as silicon, germanium, and other group III-V and group IV materials like gallium nitride (GaN), gallium arsenide (GaAs), indium phosphide (InP), or other materials.

The interposer 1000 may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, low noise amplifiers, power management devices, antennas, antenna arrays for beamforming, sensors, and MEMS devices may also be formed on the interposer 1000.

In accordance with embodiments of the disclosure, apparatuses or processes disclosed herein may be used in the fabrication of interposer 1000. For example, the interposer 1000, the first substrate 1002, the second substrate 1004 may include capacitors similar to those discussed herein (e.g., capacitors 100, 300, 400, 500, 600, and 700).

Figure 10:
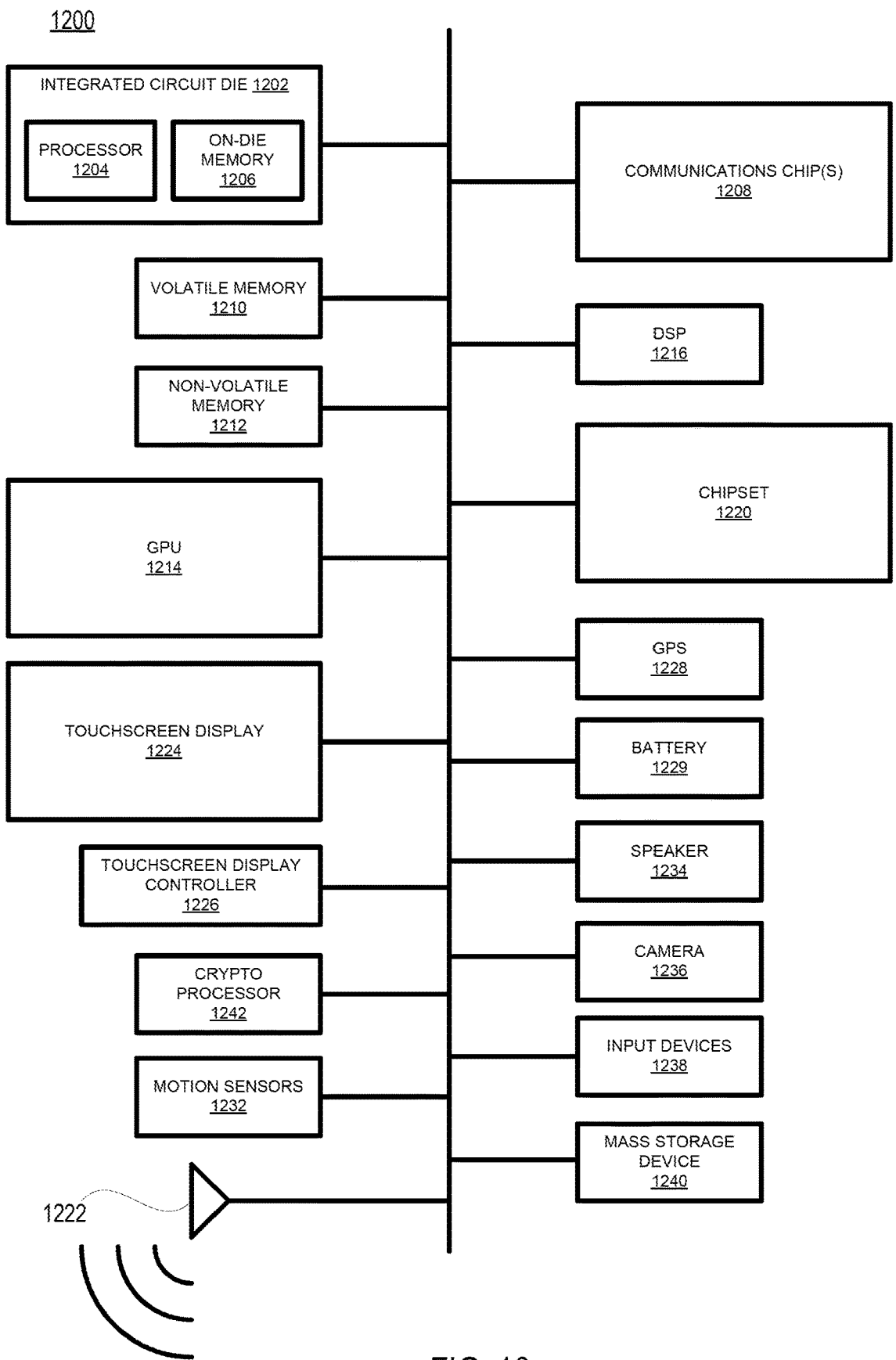
FIG. 10 illustrates a computing device in accordance with one embodiment of the disclosure.

FIG. 10 illustrates a computing device 1200 in accordance with one embodiment of the disclosure. The computing device 1200 may include a number of components. In one embodiment, these components are attached to one or more motherboards. In an alternate embodiment, some or all of these components are fabricated onto a single system-on-a-chip (SoC) die, such as an SoC used for mobile devices. The components in the computing device 1200 include, but are not limited to, an integrated circuit die 1202 and at least one communications chip 1208 (also referred to herein as "communications logic unit" 1208). In some implementations the communications chip 1208 is fabricated within the integrated circuit die 1202 while in other implementations the communications logic unit 1208 is fabricated in a separate integrated circuit chip that may be bonded to a substrate or motherboard that is shared with or electronically coupled to the integrated circuit die 1202. The integrated circuit die 1202 may include a processor 1204 (e.g., a CPU) as well as on-die memory 1206, often used as cache memory, which can be provided by technologies such as embedded DRAM (eDRAM), SRAM, or spin-transfer torque memory (STT-M RAM).

Computing device 1200 may include other components that may or may not be physically and electrically coupled to the motherboard or fabricated within an SoC die. These other components include, but are not limited to, volatile memory 1210 (e.g., DRAM), non-volatile memory 1212 (e.g., ROM or flash memory), a graphics processing unit (GPU) 1214, a digital signal processor (DSP) 1216, a crypto processor 1242 (e.g., a specialized processor that executes cryptographic algorithms within hardware), a chipset 1220, at least one antenna 1222 (in some implementations two or more antenna may be used), a display or a touchscreen display 1224, a touchscreen display controller 1226, a battery 1229 or other power source (not shown), a power amplifier (not shown), a voltage regulator (not shown), a global positioning system (GPS) device 1228, a compass (not shown), one or more motion sensors 1232 (e.g., a motion coprocessor such as an accelerometer, a gyroscope, a compass, etc.), a microphone (not shown), a speaker 1234, a camera 1236, user input devices 1238 (such as a keyboard, mouse, stylus, and touchpad), and a mass storage device 1240 (such as hard disk drive, compact disk (CD), digital versatile disk (DVD), and so forth). The computing device 1200 may incorporate further transmission, telecommunication, or radio functionality not already described herein. In some implementations, the computing device 1200 includes a radio that is used to communicate over a distance by modulating and radiating electromagnetic waves in air or space. In further implementations, the computing device 1200 includes a transmitter and a receiver (or a transceiver) that is used to communicate over a distance by modulating and radiating electromagnetic waves in air or space.

The communications chip 1208 may include a communications logic unit configured to transfer data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1208 may implement any of a number of wireless standards or protocols, including but not limited to Wi-Fi (IEEE 802.11ad family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, 5G NR, and beyond. The computing device 1200 may include a plurality of communications chips 1208. For instance, a first communications chip 1208 may be dedicated to shorter range wireless communications such as Wi-Fi, NFC, and Bluetooth and a second communications chip 1208 may be dedicated to longer range wireless communications such as GPS, EDGE, GPRS, CDMA, WiMAX, LTE, Ev-DO, and others.

The processor 1204 of the computing device 1200 includes one or more devices, such as capacitors similar to those discussed herein (e.g., capacitors 100, 300, 400, 500, 600, and 700). The term "processor" may refer to any device or portion of a device that processes electronic data from registers and/or memory to transform that electronic data into other electronic data that may be stored in registers and/or memory.

The communications logic unit 1208 may also include one or more devices, such as capacitors similar to those discussed herein (e.g., capacitors 100, 300, 400, 500, 600, and 700).

In further embodiments, another component housed within the computing device 1200 may contain one or more devices, such as capacitors similar to those discussed herein (e.g., capacitors 100, 300, 400, 500, 600, and 700).

In various embodiments, the computing device 1200 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

EXAMPLES

The following is a non-exhaustive list of example embodiments that fall within the scope of the disclosure. In order to avoid complexity in providing the disclosure, not all of the examples listed below are separately and explicitly disclosed as having been contemplated herein as combinable with all of the others of the examples listed below and other embodiments disclosed hereinabove. Unless one of ordinary skill in the art would understand that these examples listed below, and the above disclosed embodiments, are not combinable, it is contemplated within the scope of the disclosure that such examples and embodiments are combinable.

Example 1: A semiconductor device, comprising: a capacitor comprising: a plate-to-plate capacitor including at least a first plate and a second plate, the second plate in proximity to the first plate; and a finger-to-finger capacitor in proximity to the first plate, the finger-to-finger capacitor comprising a first plurality of finger elements and a second plurality of finger elements, the second plurality of finger elements interleaved with the first plurality of finger elements, the first plurality of finger elements electrically connected to the first plate and the second plurality of finger elements electrically connected to the second plate; wherein the second plurality of finger elements and the first plate form additional plate-to-plate capacitors.

Example 2: The semiconductor device of Example 1, further comprising another plate-to-plate capacitor including a third plate and a fourth plate, the third plate in proximity to the first plate, the first plate electrically connected to the fourth plate and the second plate electrically connected to the third plate.

Example 3: The semiconductor device of Example 2, wherein the finger-to-finger capacitor is in proximity to the third plate and the first plurality of finger elements and the third plate form other additional plate-to-plate capacitors.

Example 4: The semiconductor device of Example 3, wherein the first plurality of finger elements are wider than the second plurality of finger elements in portions of the finger-to-finger capacitor that are proximate to the third plate.

Example 5: The semiconductor device according to any one of Examples 1-4, wherein individual ones of the second plurality of finger elements are wider than individual ones of the first plurality of finger elements in portions of the finger-to-finger capacitor that are proximate to the first plate.

Example 6: The semiconductor device according to any one of Examples 2-5, wherein the first plate and the third plate are at least substantially coplanar.

Example 7: A semiconductor device, comprising: a first plate; a second plate in proximity to the first plate, the first plate and the second plate forming a first plate-to-plate capacitor; a third plate electrically connected to the second plate, the third plate at least substantially coplanar with the first plate; and a fourth plate electrically connected to the first plate, the fourth plate at least substantially coplanar with the second plate, the fourth plate in proximity to the third plate, the third plate and the fourth plate forming a second plate-to-plate capacitor.

Example 8: The semiconductor device of Example 7, further comprising a finger-to-finger capacitor in proximity to the first plate and the third plate and electrically connected in parallel to the first plate-to-plate capacitor and the second plate-to-plate capacitor.

Example 9: The semiconductor device of Example 8, wherein individual finger elements of the finger-to-finger capacitor extend outward from transmission lines located between the first plate and the third plate.

Example 10: The semiconductor device of Example 9, wherein the transmission lines are vertically offset from the first plate and the third plate.

Example 11: The semiconductor device according to any one of Examples 7-10, wherein the finger-to-finger capacitor comprises a multi-layer finger-to-finger capacitor.

Example 12: The semiconductor device according to any one of Examples 7-11, wherein the semiconductor device includes a device that is configured to operate at frequencies above 23 gigahertz (GHz).

Example 13: An electronic device, comprising: a first capacitor terminal; a second capacitor terminal; a plate-to-plate capacitor including: a first plate electrically connected to the first capacitor terminal, the first plate comprising an electrically conductive material; and a second plate electrically connected to the second capacitor terminal, the second plate comprising an electrically conductive material, the second plate at least substantially parallel to the first plate and offset from the first plate in a substantially normal direction from the first plate; and a finger-to-finger capacitor proximate to the first plate of the plate-to-plate capacitor, the finger-to-finger capacitor comprising: a first plurality of finger elements electrically connected to the first capacitor terminal, the first plurality of finger elements comprising electrically conductive material; and a second plurality of finger elements interleaved with the first plurality of finger elements, the second plurality of finger elements electrically connected to the second capacitor terminal, the second plurality of finger elements comprising electrically conductive material; wherein at least a portion of the second plurality of finger elements is located in proximity to the first plate.

Example 14: The electronic device of Example 13, wherein the at least the portion of the second plurality of finger elements that is located in proximity to the first plate are wider than a portion of the first plurality of finger elements that is interleaved with the at least the portion of the second plurality of finger elements.

Example 15: A capacitor, comprising: a first capacitor terminal; a second capacitor terminal; a first plate electrically connected to the first capacitor terminal, the first plate comprising electrically conductive material; a second plate electrically connected to the second capacitor terminal, the second plate comprising an electrically conductive material, the second plate at least substantially parallel to the first plate and offset from the first plate in a direction at least substantially normal to the first plate; a third plate electrically connected to the second capacitor terminal, the third plate comprising electrically conductive material, the third plate at least substantially coplanar with the first plate and offset from the first plate in an at least substantially parallel direction from the first plate; and a fourth plate electrically connected to the first capacitor terminal, the fourth plate comprising electrically conductive material, the fourth plate at least substantially coplanar with the second plate and offset from the second plate in a substantially parallel direction from the second plate, the fourth plate at least substantially parallel to the third plate and offset from the third plate in a direction at least substantially normal to the third plate.

Example 16: The capacitor of Example 15, further comprising: a first plurality of finger elements comprising electrically conductive material, each of the first plurality of finger elements electrically connected to the first capacitor terminal; and a second plurality of finger elements interleaved with the first plurality of finger elements to form a finger-to-finger sub-capacitor, the second plurality of finger elements comprising electrically conductive material, the second plurality of finger elements electrically connected to the second capacitor terminal; wherein: at least a portion of the second plurality of finger elements is located in proximity to the first plate to induce capacitive coupling between the first plate and the at least the portion of the second plurality of finger elements responsive to a voltage potential difference applied across the first capacitor terminal and the second capacitor terminal; and at least a portion of the first plurality of finger elements is located in proximity to the third plate to induce capacitive coupling between the third plate and the at least the portion of the first plurality of finger elements responsive to the voltage potential difference applied across the first capacitor terminal and the second capacitor terminal.

Example 17: The capacitor of Example 16, wherein the at least the portion of the second plurality of finger elements that is located in proximity to the first plate is wider than a portion of the first plurality of finger elements that is located in the proximity to the first plate.

Example 18: The capacitor according to any one of Examples 16 and 17, wherein the at least the portion of the first plurality of finger elements that is located in proximity to the third plate is wider than a portion of the second plurality of finger elements that is located in the proximity to the third plate.

Example 19: The capacitor according to any one of Examples 16-18, wherein each of the first plurality of finger elements and each of the second plurality of finger elements is arranged in a substantially coplanar arrangement.

Example 20: The capacitor according to any one of Examples 16-18, wherein some of the first plurality of finger elements and some of the second plurality of finger elements are arranged in each of a plurality of substantially coplanar arrangements, each one of the plurality of substantially coplanar arrangements offset from the first plate and the third plate by a different offset distance.

Example 21: The capacitor according to any one of Examples 16-20, further comprising: a first transmission line configured to electrically connect the first capacitor terminal to the first plurality of finger elements; and a second transmission line configured to electrically connect the second capacitor terminal to the second plurality of finger elements.

Example 22: The capacitor of Example 21, wherein the first transmission line and the second transmission line are at least substantially coplanar with the first plate and the third plate.

Example 23: The capacitor of Example 22, further comprising at least one first via electrically connecting the first transmission line to the first plurality of finger elements and at least one second via electrically connecting the second transmission line to the second plurality of finger elements, wherein the first transmission line is located between the second transmission line and the first plate.

Example 24: The capacitor of Example 22, further comprising at least one first via electrically connecting the first transmission line to the first plurality of finger elements and at least one second via electrically connecting the second transmission line to the second plurality of finger elements, wherein the second transmission line is located between the first plate and the second transmission line.

Example 25: The capacitor of Example 21, wherein the first transmission line and the second transmission line are offset vertically from a position between the first plate and the third plate.

Example 26: A method of forming a semiconductor device, the method comprising: forming a capacitor, the forming comprising: forming a plate-to-plate capacitor including at least a first plate and a second plate, the second plate in proximity to the first plate; and forming a finger-to-finger capacitor in proximity to the first plate, the finger-to-finger capacitor comprising a first plurality of finger elements and a second plurality of finger elements, the second plurality of finger elements interleaved with the first plurality of finger elements, the first plurality of finger elements electrically connected to the first plate and the second plurality of finger elements electrically connected to the second plate; wherein the second plurality of finger elements and the first plate form additional plate-to-plate capacitors.

Example 27: The method of Example 26, wherein forming a capacitor further comprises forming another plate-to-plate capacitor including a third plate and a fourth plate, the third plate in proximity to the first plate, the first plate electrically connected to the fourth plate and the second plate electrically connected to the third plate.

Example 28: The method of Example 27, wherein forming another plate-to-plate capacitor comprises forming the third plate in proximity to the finger-to-finger capacitor, wherein the first plurality of finger elements and the third plate form other additional plate-to-plate capacitors.

Example 29: The method of Example 28, wherein forming a finger-to-finger capacitor comprises forming the first plurality of finger elements wider than the second plurality of finger elements in portions of the finger-to-finger capacitor that are proximate to the third plate.

Example 30: The method according to any one of Examples 26-29, wherein forming a finger-to-finger capacitor comprises forming individual ones of the second plurality of finger elements wider than individual ones of the first plurality of finger elements in portions of the finger-to-finger capacitor that are proximate to the first plate.

Example 31: The method according to any one of Examples 27-30, wherein the first plate and the third plate are at least substantially coplanar.

Example 32: A method of forming a semiconductor device, the method comprising: forming a first plate; forming a second plate in proximity to the first plate, the first plate and the second plate forming a first plate-to-plate capacitor; forming a third plate electrically connected to the second plate, the third plate at least substantially coplanar with the first plate; and forming a fourth plate electrically connected to the first plate, the fourth plate at least substantially coplanar with the second plate, the fourth plate in proximity to the third plate, the third plate and the fourth plate forming a second plate-to-plate capacitor.

Example 33: The method of Example 32, further comprising forming a finger-to-finger capacitor in proximity to the first plate and the third plate and electrically connecting the finger-to-finger capacitor in parallel to the first plate-to-plate capacitor and the second plate-to-plate capacitor.

Example 34: The method of Example 33, wherein forming a finger-to-finger capacitor comprises forming individual finger elements of the finger to-finger capacitor to extend outward from transmission lines located between the first plate and the third plate.

Example 35: The method of Example 34, further comprising vertically offsetting the transmission lines from the first plate and the third plate.

Example 36: The method according to any one of Examples 32-35, wherein forming a finger-to-finger capacitor comprises forming a multi-layer finger-to-finger capacitor.

Example 37: The method according to any one of Examples 32-36, wherein the semiconductor device includes a device that is configured to operate at frequencies above 23 gigahertz (GHz).

Example 38: A method of operating an electronic device, comprising: applying an electrical signal across a first capacitor terminal and a second capacitor terminal; conducting the electrical signal to a plate-to-plate capacitor including: a first plate electrically connected to the first capacitor terminal, the first plate comprising an electrically conductive material; and a second plate electrically connected to the second capacitor terminal, the second plate comprising an electrically conductive material, the second plate at least substantially parallel to the first plate and offset from the first plate in a substantially normal direction from the first plate; and conducting the electrical signal to a finger-to-finger capacitor proximate to the first plate of the plate-to-plate capacitor, the finger-to-finger capacitor comprising: a first plurality of finger elements electrically connected to the first capacitor terminal, the first plurality of finger elements comprising electrically conductive material; and a second plurality of finger elements interleaved with the first plurality of finger elements, the second plurality of finger elements electrically connected to the second capacitor terminal, the second plurality of finger elements comprising electrically conductive material; wherein at least a portion of the second plurality of finger elements is located in proximity to the first plate.

Example 39: The method of Example 38, wherein conducting the electrical signal to a finger-to-finger capacitor includes conducting the electrical signal to at least a portion of the second plurality of finger elements that is located in proximity to the first plate, wherein the at least the portion of the second plurality of finger elements that is located in proximity to the first plate is wider than a portion of the first plurality of finger elements that is interleaved with the at least the portion of the second plurality of finger elements.

Example 40: A method of operating a capacitor, the method comprising: applying an electrical signal across a first capacitor terminal and a second capacitor terminal; conducting the electrical signal to a first plate electrically connected to the first capacitor terminal, the first plate comprising electrically conductive material; conducting the electrical signal to a second plate electrically connected to the second capacitor terminal, the second plate comprising an electrically conductive material, the second plate at least substantially parallel to the first plate and offset from the first plate in a direction at least substantially normal to the first plate; conducting the electrical signal to a third plate electrically connected to the second capacitor terminal, the third plate comprising electrically conductive material, the third plate at least substantially coplanar with the first plate and offset from the first plate in an at least substantially parallel direction from the first plate; and conducting the electrical signal to a fourth plate electrically connected to the first capacitor terminal, the fourth plate comprising electrically conductive material, the fourth plate at least substantially coplanar with the second plate and offset from the second plate in a substantially parallel direction from the second plate, the fourth plate at least substantially parallel to the third plate and offset from the third plate in a direction at least substantially normal to the third plate.

Example 41: The method of Example 40, further comprising: conducting the electrical signal to a first plurality of finger elements comprising electrically conductive material, each of the first plurality of finger elements electrically connected to the first capacitor terminal; and conducting the electrical signal to a second plurality of finger elements interleaved with the first plurality of finger elements to form a finger-to-finger sub-capacitor, the second plurality of finger elements comprising electrically conductive material, the second plurality of finger elements electrically connected to the second capacitor terminal; wherein: at least a portion of the second plurality of finger elements is located in proximity to the first plate to induce capacitive coupling between the first plate and the at least the portion of the second plurality of finger elements responsive to a voltage potential difference applied across the first capacitor terminal and the second capacitor terminal; and at least a portion of the first plurality of finger elements is located in proximity to the third plate to induce capacitive coupling between the third plate and the at least the portion of the first plurality of finger elements responsive to the voltage potential difference applied across the first capacitor terminal and the second capacitor terminal.

Example 42: The method of Example 41, wherein the at least the portion of the second plurality of finger elements that is located in proximity to the first plate is wider than a portion of the first plurality of finger elements that is located in the proximity to the first plate.

Example 43: The method according to any one of Examples 41 and 42, wherein the at least the portion of the first plurality of finger elements that is located in proximity to the third plate is wider than a portion of the second plurality of finger elements that is located in the proximity to the third plate.

Example 44: The method according to any one of Examples 41-43, wherein each of the first plurality of finger elements and each of the second plurality of finger elements is arranged in a substantially coplanar arrangement.

Example 45: The method according to any one of Examples 41-43, wherein some of the first plurality of finger elements and some of the second plurality of finger elements are arranged in each of a plurality of substantially coplanar arrangements, each one of the plurality of substantially coplanar arrangements offset from the first plate and the third plate by a different offset distance.

Example 46: The method according to any one of Examples 41-45, wherein: conducting the electrical signal to a first plurality of finger elements comprises conducting the electrical signal to the first plurality of finger elements with a first transmission line configured to electrically connect the first capacitor terminal to the first plurality of finger elements; and conducting the electrical signal to a second plurality of finger elements comprises conducting the electrical signal to the second plurality of finger elements with a second transmission line configured to electrically connect the second capacitor terminal to the second plurality of finger elements.

Example 47: The method of Example 46, wherein conducting the electrical signal to a first plurality of finger elements and to a second plurality of finger elements comprises conducting the electrical signal with the first transmission line and the second transmission line that are at least substantially coplanar with the first plate and the third plate.

Example 48: The method of Example 47, further comprising: conducting the electrical signal from the first transmission line to the first plurality of finger elements with at least one first via electrically connecting the first transmission line to the first plurality of finger elements; and conducting the electrical signal from the second transmission line to the second plurality of finger elements with at least one second via electrically connecting the second transmission line to the second plurality of finger elements, wherein the first transmission line is located between the second transmission line and the first plate.

Example 49: The method of Example 47, further comprising: conducting the electrical signal from the first transmission line to the first plurality of finger elements with at least one first via electrically connecting the first transmission line to the first plurality of finger elements; and conducting the electrical signal from the second transmission line to the second plurality of finger elements with at least one second via electrically connecting the second transmission line to the second plurality of finger elements, wherein the second transmission line is located between the first plate and the second transmission line.

Example 50: The method of Example 46, wherein the first transmission line and the second transmission line are offset vertically from a position between the first plate and the third plate.

Example 51: A computer-readable storage medium having computer-readable instructions stored thereon, the computer-readable instructions configured to instruct one or more processors to perform at least a portion of the method according to any one of Examples 26-50.

Example 52: A means for performing the method according to any one of Examples 26-50.

CONCLUSION

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A semiconductor device, comprising:
a capacitor comprising:
a plate-to-plate capacitor including at least a first plate and a second plate, the second plate in proximity to the first plate; and
a finger-to-finger capacitor in proximity to the first plate, the finger-to-finger capacitor comprising a first plurality of finger elements and a second plurality of finger elements, the second plurality of finger elements interleaved with the first plurality of finger elements, the first plurality of finger elements electrically connected to the first plate and the second plurality of finger elements electrically connected to the second plate;
wherein the second plurality of finger elements and the first plate form additional plate-to-plate capacitors, and wherein individual ones of the second plurality of finger elements are wider than individual ones of the first plurality of finger elements in portions of the finger-to-finger capacitor that are proximate to the first plate.

2. The semiconductor device of claim 1, further comprising another plate-to-plate capacitor including a third plate and a fourth plate, the third plate in proximity to the first plate, the first plate electrically connected to the fourth plate and the second plate electrically connected to the third plate.

3. The semiconductor device of claim 2, wherein the finger-to-finger capacitor is in proximity to the third plate and the first plurality of finger elements and the third plate form other additional plate-to-plate capacitors.

4. The semiconductor device of claim 3, wherein the first plurality of finger elements are wider than the second plurality of finger elements in portions of the finger-to-finger capacitor that are proximate to the third plate.

5. The semiconductor device of claim 2, wherein the first plate and the third plate are at least substantially coplanar.

6. A semiconductor device, comprising:
a first plate;
a second plate in proximity to the first plate, the first plate and the second plate forming a first plate-to-plate capacitor;
a third plate electrically connected to the second plate, the third plate at least substantially coplanar with the first plate;
a fourth plate electrically connected to the first plate, the fourth plate at least substantially coplanar with the second plate, the fourth plate in proximity to the third plate, the third plate and the fourth plate forming a second plate-to-plate capacitor; and
a finger-to-finger capacitor in proximity to the first plate and the third plate and electrically connected in parallel to the first plate-to-plate capacitor and the second plate-to-plate capacitor, wherein individual finger elements of the finger-to-finger capacitor extend outward from transmission lines located between the first plate and the third plate.

7. The semiconductor device of claim 6, wherein the transmission lines are vertically offset from the first plate and the third plate.

8. The semiconductor device of claim 6, wherein the finger-to-finger capacitor comprises a multi-layer finger-to-finger capacitor.

9. The semiconductor device of claim 6, wherein the semiconductor device includes a device that is configured to operate at frequencies above 23 gigahertz (GHz).

10. A capacitor, comprising:
a first capacitor terminal;
a second capacitor terminal;
a first plate electrically connected to the first capacitor terminal, the first plate comprising electrically conductive material;
a second plate electrically connected to the second capacitor terminal, the second plate comprising an electrically conductive material, the second plate at least substantially parallel to the first plate and offset from the first plate in a direction at least substantially normal to the first plate;
a third plate electrically connected to the second capacitor terminal, the third plate comprising electrically conductive material, the third plate at least substantially coplanar with the first plate and offset from the first plate in an at least substantially parallel direction from the first plate;
a fourth plate electrically connected to the first capacitor terminal, the fourth plate comprising electrically conductive material, the fourth plate at least substantially coplanar with the second plate and offset from the second plate in a substantially parallel direction from the second plate, the fourth plate at least substantially parallel to the third plate and offset from the third plate in a direction at least substantially normal to the third plate;
a first plurality of finger elements comprising electrically conductive material, each of the first plurality of finger elements electrically connected to the first capacitor terminal; and
a second plurality of finger elements interleaved with the first plurality of finger elements to form a finger-to-finger sub-capacitor, the second plurality of finger elements comprising electrically conductive material, the second plurality of finger elements electrically connected to the second capacitor terminal;
wherein:
at least a portion of the second plurality of finger elements is located in proximity to the first plate to induce capacitive coupling between the first plate and the at least the portion of the second plurality of finger elements responsive to a voltage potential difference applied across the first capacitor terminal and the second capacitor terminal; and at least a portion of the first plurality of finger elements is located in proximity to the third plate to induce capacitive coupling between the third plate and the at least the portion of the first plurality of finger elements responsive to the voltage potential difference applied across the first capacitor terminal and the second capacitor terminal, wherein the at least the portion of the second plurality of finger elements that is located in proximity to the first plate is wider than a portion of the first plurality of finger elements that is located in the proximity to the first plate.

11. The capacitor of claim 10, wherein the at least the portion of the first plurality of finger elements that is located in proximity to the third plate is wider than a portion of the second plurality of finger elements that is located in the proximity to the third plate.

12. The capacitor of claim 10, wherein each of the first plurality of finger elements and each of the second plurality of finger elements is arranged in a substantially coplanar arrangement.

13. The capacitor of claim 10, wherein some of the first plurality of finger elements and some of the second plurality of finger elements are arranged in each of a plurality of substantially coplanar arrangements, each one of the plurality of substantially coplanar arrangements offset from the first plate and the third plate by a different offset distance.

14. The capacitor of claim 10, further comprising:
a first transmission line configured to electrically connect the first capacitor terminal to the first plurality of finger elements; and
a second transmission line configured to electrically connect the second capacitor terminal to the second plurality of finger elements.

15. The capacitor of claim 14, wherein the first transmission line and the second transmission line are at least substantially coplanar with the first plate and the third plate.

16. The capacitor of claim 15, further comprising at least one first via electrically connecting the first transmission line to the first plurality of finger elements and at least one second via electrically connecting the second transmission line to the second plurality of finger elements, wherein the first transmission line is located between the second transmission line and the first plate.

17. The capacitor of claim 15, further comprising at least one first via electrically connecting the first transmission line to the first plurality of finger elements and at least one second via electrically connecting the second transmission line to the second plurality of finger elements, wherein the second transmission line is located between the first plate and the second transmission line.

18. The capacitor of claim 14, wherein the first transmission line and the second transmission line are offset vertically from a position between the first plate and the third plate.

19. A capacitor, comprising:
a first capacitor terminal;
a second capacitor terminal;
a first plate electrically connected to the first capacitor terminal, the first plate comprising electrically conductive material;
a second plate electrically connected to the second capacitor terminal, the second plate comprising an electrically conductive material, the second plate at least substantially parallel to the first plate and offset from the first plate in a direction at least substantially normal to the first plate;
a third plate electrically connected to the second capacitor terminal, the third plate comprising electrically conductive material, the third plate at least substantially coplanar with the first plate and offset from the first plate in an at least substantially parallel direction from the first plate;
a fourth plate electrically connected to the first capacitor terminal, the fourth plate comprising electrically conductive material, the fourth plate at least substantially coplanar with the second plate and offset from the second plate in a substantially parallel direction from the second plate, the fourth plate at least substantially parallel to the third plate and offset from the third plate in a direction at least substantially normal to the third plate;
a first plurality of finger elements comprising electrically conductive material, each of the first plurality of finger elements electrically connected to the first capacitor terminal; and
a second plurality of finger elements interleaved with the first plurality of finger elements to form a finger-to-finger sub-capacitor, the second plurality of finger elements comprising electrically conductive material, the second plurality of finger elements electrically connected to the second capacitor terminal;

wherein:
at least a portion of the second plurality of finger elements is located in proximity to the first plate to induce capacitive coupling between the first plate and the at least the portion of the second plurality of finger elements responsive to a voltage potential difference applied across the first capacitor terminal and the second capacitor terminal; and at least a portion of the first plurality of finger elements is located in proximity to the third plate to induce capacitive coupling between the third plate and the at least the portion of the first plurality of finger elements responsive to the voltage potential difference applied across the first capacitor terminal and the second capacitor terminal, wherein the at least the portion of the first plurality of finger elements that is located in proximity to the third plate is wider than a portion of the second plurality of finger elements that is located in the proximity to the third plate.

20. A capacitor, comprising:
a first capacitor terminal;
a second capacitor terminal;
a first plate electrically connected to the first capacitor terminal, the first plate comprising electrically conductive material;
a second plate electrically connected to the second capacitor terminal, the second plate comprising an electrically conductive material, the second plate at least substantially parallel to the first plate and offset from the first plate in a direction at least substantially normal to the first plate;
a third plate electrically connected to the second capacitor terminal, the third plate comprising electrically conductive material, the third plate at least substantially coplanar with the first plate and offset from the first plate in an at least substantially parallel direction from the first plate;
a fourth plate electrically connected to the first capacitor terminal, the fourth plate comprising electrically conductive material, the fourth plate at least substantially coplanar with the second plate and offset from the second plate in a substantially parallel direction from the second plate, the fourth plate at least substantially parallel to the third plate and offset from the third plate in a direction at least substantially normal to the third plate;

a first plurality of finger elements comprising electrically conductive material, each of the first plurality of finger elements electrically connected to the first capacitor terminal; and a second plurality of finger elements interleaved with the first plurality of finger elements to form a finger-to-finger sub-capacitor, the second plurality of finger elements comprising electrically conductive material, the second plurality of finger elements electrically connected to the second capacitor terminal;

wherein:

at least a portion of the second plurality of finger elements is located in proximity to the first plate to induce capacitive coupling between the first plate and the at least the portion of the second plurality of finger elements responsive to a voltage potential difference applied across the first capacitor terminal and the second capacitor terminal;

at least a portion of the first plurality of finger elements is located in proximity to the third plate to induce capacitive coupling between the third plate and the at least the portion of the first plurality of finger elements responsive to the voltage potential difference applied across the first capacitor terminal and the second capacitor terminal;

a first transmission line configured to electrically connect the first capacitor terminal to the first plurality of finger elements; and a second transmission line configured to electrically connect the second capacitor terminal to the second plurality of finger elements.

* * * * *